US012599925B2

(12) United States Patent
Takahashi

(10) Patent No.: US 12,599,925 B2
(45) Date of Patent: Apr. 14, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventor: Tomohiro Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 327 days.

(21) Appl. No.: 17/513,986

(22) Filed: Oct. 29, 2021

(65) Prior Publication Data

US 2022/0134375 A1　May 5, 2022

(30) Foreign Application Priority Data

Oct. 30, 2020　(JP) ................................. 2020-183211

(51) Int. Cl.
*B05C 3/09*　　(2006.01)
*B05C 11/10*　　(2006.01)
*H01L 21/67*　　(2006.01)

(52) U.S. Cl.
CPC ........... *B05C 3/09* (2013.01); *B05C 11/1002* (2013.01); *H01L 21/67023* (2013.01)

(58) Field of Classification Search
CPC .. B05C 3/09; B05C 11/1002; H01L 21/67023
See application file for complete search history.

(56) References Cited

U.S. PATENT DOCUMENTS

| | | | |
|---|---|---|---|
| 7,807,017 B2 | 10/2010 | Kim et al. | 156/345.11 |
| 10,109,508 B2 | 10/2018 | Ashidate et al. | |
| 10,483,137 B2 | 11/2019 | Masutomi et al. | 156/345.11 |
| 2005/0161839 A1 | 7/2005 | Abiko et al. | |
| 2008/0017313 A1* | 1/2008 | Kim | H01L 21/67086 156/345.11 |

(Continued)

FOREIGN PATENT DOCUMENTS

| | | |
|---|---|---|
| CN | 209000877 U | 6/2019 |
| CN | 110943006 A | 3/2020 |

(Continued)

OTHER PUBLICATIONS

Kulkarni et al. "Bubble Formation and Bubble Rise Velocity in Gas-Liquid Systems: A Review", May 4, 2005, Ind. Eng. Chem. Res., 2005, 44, 5873-5931 (Year: 2005).*

(Continued)

*Primary Examiner* — Parviz Hassanzadeh
*Assistant Examiner* — Margaret Klunk
(74) *Attorney, Agent, or Firm* — OSTROLENK FABER LLP

(57)　　　　ABSTRACT

A substrate processing apparatus includes a substrate holding section that holds a substrate, a processing tank that stores a processing liquid allowing the substrate held by the substrate holding section to be immersed in, and a plurality of bubble generating pipes that each supply a gas to the processing liquid to generate bubbles in the processing liquid. Of the plurality of bubble generating pipes, a flow rate of a gas supplied to an outer bubble generating pipe located below an outer region of the substrate immersed in the processing liquid differs from a flow rate of a gas supplied to an inner bubble generating pipe located below a central region of the substrate.

9 Claims, 16 Drawing Sheets

(56)　　　　References Cited

U.S. PATENT DOCUMENTS

| | | | | |
|---|---|---|---|---|
| 2010/0032410 | A1* | 2/2010 | Ootaguro | H01L 21/67086 |
| | | | | 427/430.1 |
| 2010/0213124 | A1* | 8/2010 | Takabatake | B01D 63/0822 |
| | | | | 210/636 |
| 2010/0224541 | A1* | 9/2010 | Takabatake | B01D 61/20 |
| | | | | 210/220 |
| 2015/0197861 | A1* | 7/2015 | Tice | H01L 21/68771 |
| | | | | 156/345.23 |
| 2015/0380280 | A1 | 12/2015 | Amiya et al. | |
| 2018/0025927 | A1* | 1/2018 | Masutomi | H01L 21/67086 |
| | | | | 438/704 |
| 2018/0082862 | A1* | 3/2018 | Ashidate | H01L 21/31111 |
| 2018/0174856 | A1* | 6/2018 | Shomori | H01L 21/30604 |
| 2019/0080937 | A1* | 3/2019 | Tsuchiya | H01L 21/67253 |
| 2019/0148176 | A1 | 5/2019 | Tanaka et al. | |
| 2019/0355595 | A1* | 11/2019 | Sun | H01L 21/30604 |
| 2020/0098597 | A1 | 3/2020 | Takahashi et al. | |
| 2020/0227290 | A1* | 7/2020 | Kimura | H01L 21/67742 |
| 2023/0274956 | A1* | 8/2023 | Kimura | H01L 21/67051 |
| | | | | 134/26 |

FOREIGN PATENT DOCUMENTS

| | | | |
|---|---|---|---|
| JP | 2005-244162 | A | 9/2005 |
| JP | 2007-324567 | A | 12/2007 |
| JP | 2010-103379 | A | 5/2010 |
| JP | 2018-046262 | A | 3/2018 |
| JP | 6632684 | B | 1/2020 |
| JP | 2020-021822 | A | 2/2020 |
| JP | 2020-113621 | A | 7/2020 |
| KR | 10-2007-0116450 | A | 12/2007 |
| KR | 10-2018-0010993 | A | 1/2018 |
| WO | WO 2015/064657 | A1 | 5/2015 |
| WO | WO 2016/204145 | A1 | 12/2016 |

OTHER PUBLICATIONS

Office Action dated Jul. 18, 2023, issued for the corresponding Korean Patent Application No. 10-2021-0147243 and its English translation attached.

Zhang Weifeng, "Research on Wet Etching Process and Equipment Manufacturing Technology of Quartz MEMS Sensor", Equipment for Electronic Products Manufacturing, vol. 49, Issue 2, pp. 29-33, May 20, 2020, and English Abstract.

* cited by examiner

SUBSTRATE PROCESSING APPARATUS AND SUBSTRATE PROCESSING METHOD

INCORPORATION BY REFERENCE

The present application claims priority under 35 U.S.C. § 119 to Japanese Patent Application No. 2020-183211, filed on Oct. 30, 2020. The contents of this application are incorporated herein by reference in their entirety.

BACKGROUND

The present disclosure relates to a substrate processing apparatus and a substrate processing method.

It is known that substrates used for electronic components such as semiconductor devices and liquid crystal display devices are processed by a substrate processing apparatus. A substrate can be processed by being immersed in a processing liquid in a processing tank.

There is an increasing demand for uniform processing of the substrates according to miniaturizing and/or three-dimensionalizing semiconductor devices formed on semiconductor substrates in recent years. For example, a NAND device having a three-dimensional structure has a laminate structure in which a three-dimensional uneven structure is provided. When the processing liquid stays in concave portions of the uneven structure in a pattern of the device, the liquid replacement in the concave portions becomes insufficient. Therefore, in order to sufficiently promote the liquid replacement for the entire substrate including the concave portions, bubbles may be generated from a bubble generator with the bubble generator located below the substrate immersed in the processing tank to promote liquid replacement in the processing tank.

In a substrate processing apparatus, when a substrate is immersed and processed in a processing tank storing a phosphoric acid aqueous solution, bubbles are generated from a bubble generator located below the substrate immersed in the processing tank. The bubble generator is cylindrical in shape and has a large number of outlets (a large number of openings). A gas supply pipe that supplies water vapor to the bubble generator is connected to one end of the bubble generator. The bubble generator blows the water vapor into the phosphoric acid aqueous solution from each outlet, thereby generating bubbles containing water vapor in the phosphoric acid aqueous solution.

Further, in a substrate processing apparatus, fluids are discharged to different regions in an arrangement direction of a plurality of substrates. This improves uniformity of processing between the plurality of substrates.

SUMMARY

According to an aspect of the present disclosure, a substrate processing apparatus includes a substrate holding section that holds at least a substrate, a processing tank that stores a processing liquid allowing the substrate held by the substrate holding section to be immersed in, and a plurality of bubble generating pipes that each supply a gas to the processing liquid to generate bubbles in the processing liquid. Of the plurality of bubble generating pipes, a flow rate of a gas supplied to an outer bubble generating pipe located below an outer region of the substrate immersed in the processing liquid differs from a flow rate of a gas supplied to an inner bubble generating pipe located below a central region of the substrate.

In an embodiment, the plurality of bubble generating pipes extend parallel to a normal direction of a main surface of the substrate.

In an embodiment, of the plurality of bubble generating pipes, of the plurality of bubble generating pipes, the flow rate of the gas supplied to the outer bubble generating pipe located below the outer region of the substrate immersed in the processing liquid is larger than the flow rate of the gas supplied to the inner bubble generating pipe located below the central region of the substrate.

In an embodiment, the substrate processing apparatus further includes a plurality of gas supply pipes connected to the plurality of bubble generating pipes, and a flow rate control mechanism that controls a flow rate of a gas flowing through each of the plurality of gas supply pipes. The flow rate control mechanism controls the flow rate of the gas flowing through each of the plurality of gas supply pipes so that the flow rate of the gas supplied to the outer bubble generating pipe is larger than the flow rate of the gas supplied to the inner bubble generating pipe.

In an embodiment, the substrate processing apparatus further includes a pressure gauge that measures a pressure of a gas flowing through a gas supply pipe connected to the outer bubble generating pipe, and a pressure of a gas flowing through a gas supply pipe connected to the inner bubble generating pipe.

In an embodiment, the substrate processing apparatus further includes a controller that controls the flow rate control mechanism. The controller controls a flow rate of a gas flowing through each of the plurality of gas supply pipes based on the pressure of the gas flowing through the gas supply pipe connected to the outer bubble generating pipe, and the pressure of the gas flowing through the gas supply pipe connected to the inner bubble generating pipe.

In an embodiment, the substrate processing apparatus further includes a controller that controls the flow rate control mechanism, and storage that stores a control program. The controller controls the flow rate control mechanism according to the control program.

In an embodiment, the substrate holding section holds a plurality of substrates, which form a substrate row, aligned in a row in a row direction. The inner bubble generating pipe includes a first inner pipe and a second inner pipe. The first inner pipe is located below respective central regions of substrates, arranged at a first side of the substrate row, of the plurality of substrates. The second inner pipe is separated from the first inner pipe. The second inner pipe is aligned in a straight line along with the first inner pipe. The second inner pipe is located below respective central regions of substrates, arranged at a second side of the substrate row, of the plurality of substrates. The outer bubble generating pipes includes a first outer pipe and a second outer pipe. The first outer pipe is located below an outer region of each of substrates, arranged at the first side of the substrate row, of the plurality of substrates. The second outer pipe is separated from the first outer pipe. The second outer pipe is aligned in a straight line along with the first outer pipe. The second outer pipe is located below an outer region of each of substrates, arranged at a second side of the substrate row, of the plurality of substrates.

In an embodiment, the substrate processing apparatus further includes a liquid discharge pipe located in the processing tank.

In an embodiment, the liquid discharge pipe extends parallel to a normal direction of a main surface of the substrate.

In an embodiment, the processing liquid contains a phosphoric acid liquid.

According to another aspect of the present disclosure, a substrate processing method includes immersing a substrate in a processing liquid stored in a processing tank, and supplying a gas to each of a plurality of bubble generating pipes arranged in the processing tank so that bubbles are generated in the processing liquid and suppled to the substrate immersed in the processing liquid. The supplying the gas includes making a difference between a flow rate of a gas supplied to an outer bubble generating pipe, located below an outer region of the substrate, of the plurality of bubble generating pipes and a flow rate of a gas supplied to an inner bubble generating pipe, located below a central region of the substrate, of the plurality of bubble generating pipes.

In an embodiment, the plurality of bubble generating pipes extend parallel to a normal direction of a main surface of the substrate.

In an embodiment, in the making the difference, the flow rate of the gas supplied to the outer bubble generating pipe, located below the outer region of the substrate, of the plurality of bubble generating pipes is larger than the flow rate of the gas supplied to the inner bubble generating pipe located below the central region of the substrate.

In an embodiment, the supplying the gas includes: supplying a gas at an equal flow rate to each of the outer bubble generating pipe and the inner bubble generating pipe; and measuring, in the supplying the gas at the equal flow rate, a pressure of a gas flowing through a gas supply pipe connected to the outer bubble generating pipe, and a pressure of a gas flowing through a gas supply pipe connected to the inner bubble generating pipe. The making the difference includes setting, based on a result of the measuring, a flow rate of the gas flowing through the gas supply pipe connected to the outer bubble generating pipe and a flow rate of the gas flowing through the gas supply pipe connected to the inner bubble generating pipe.

4

Figure 9:
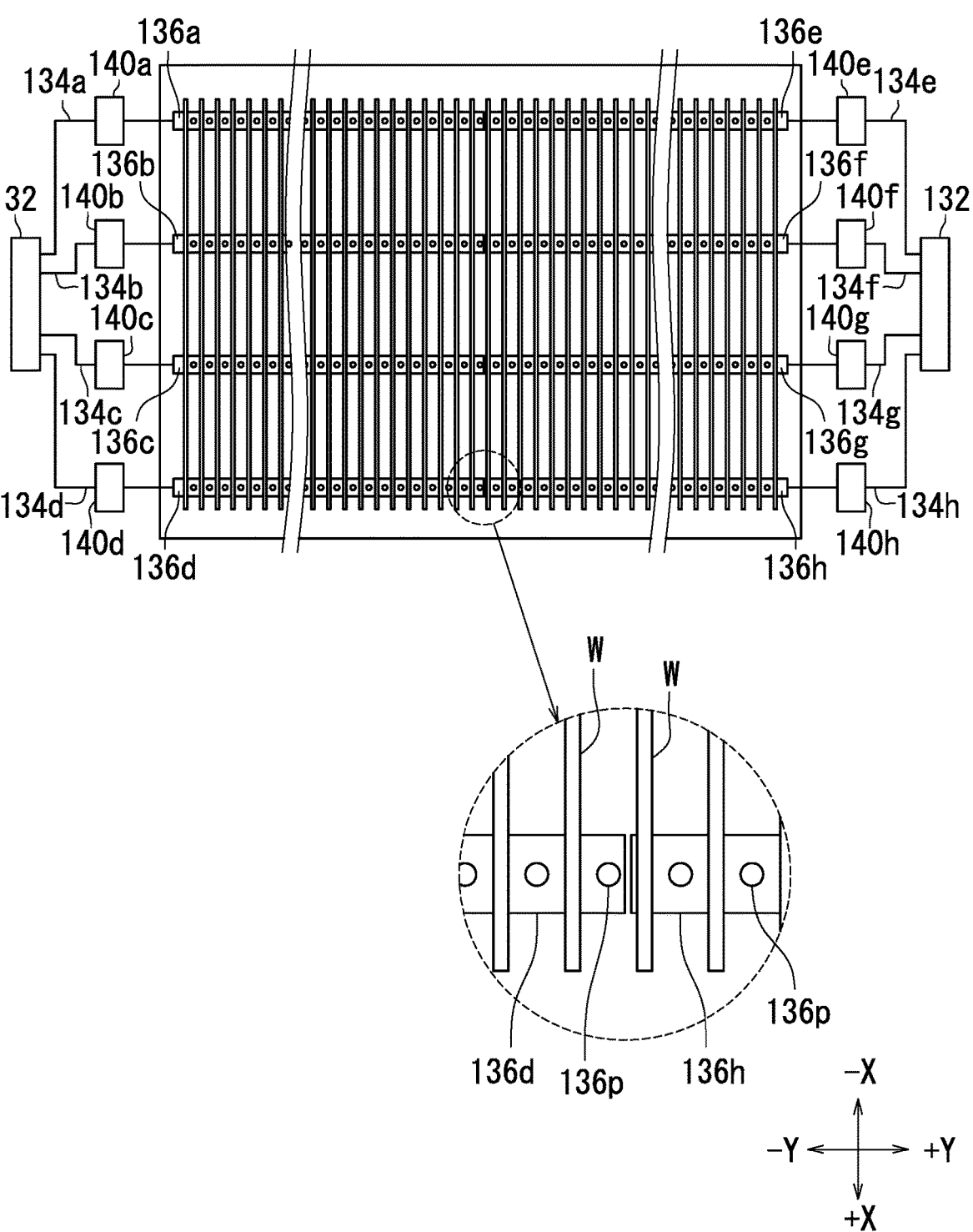

FIG. 9 is a schematic top view and a partially enlarged view of a substrate processing apparatus according to the embodiment.

Figures 10A, 10B:
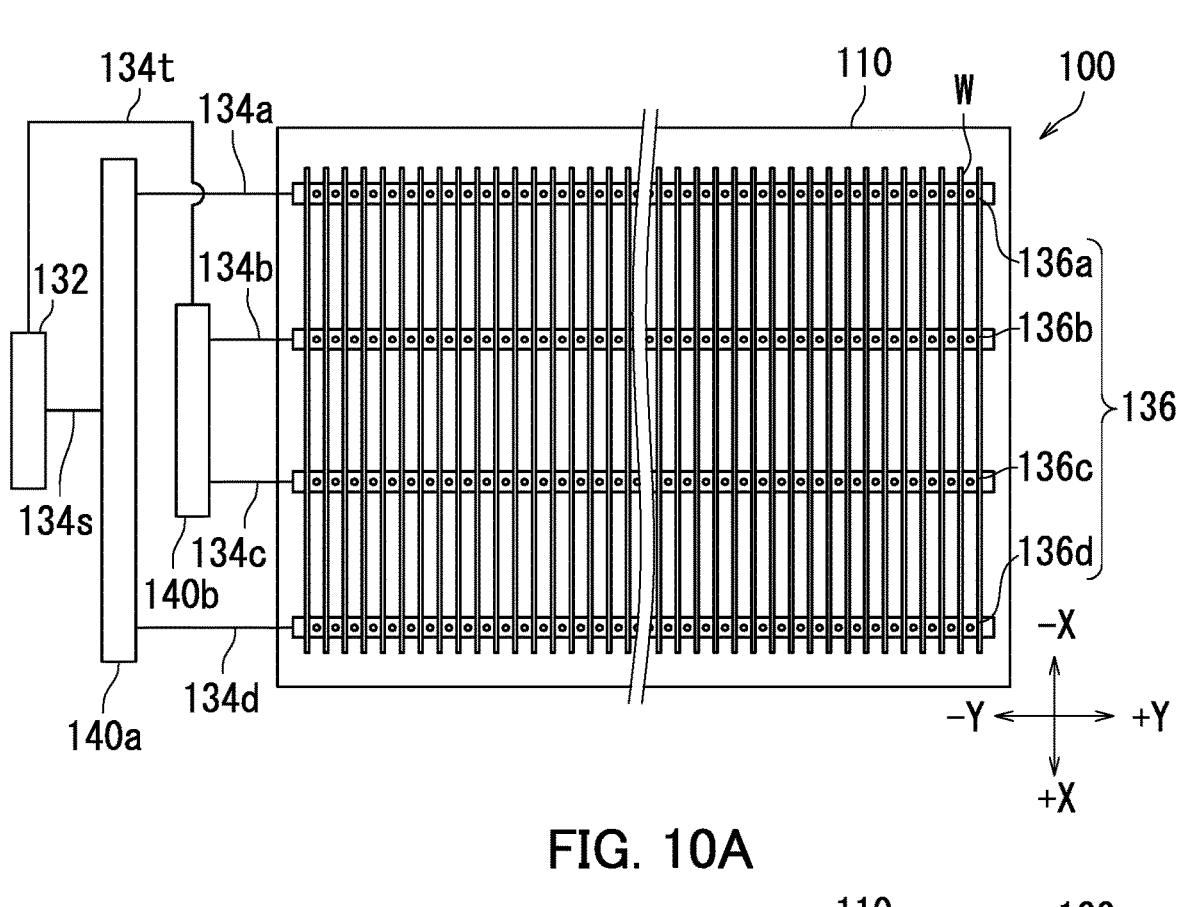

FIGS. 10A and 10B are schematic top views of a substrate processing apparatus according to the embodiment.

Figure 11:
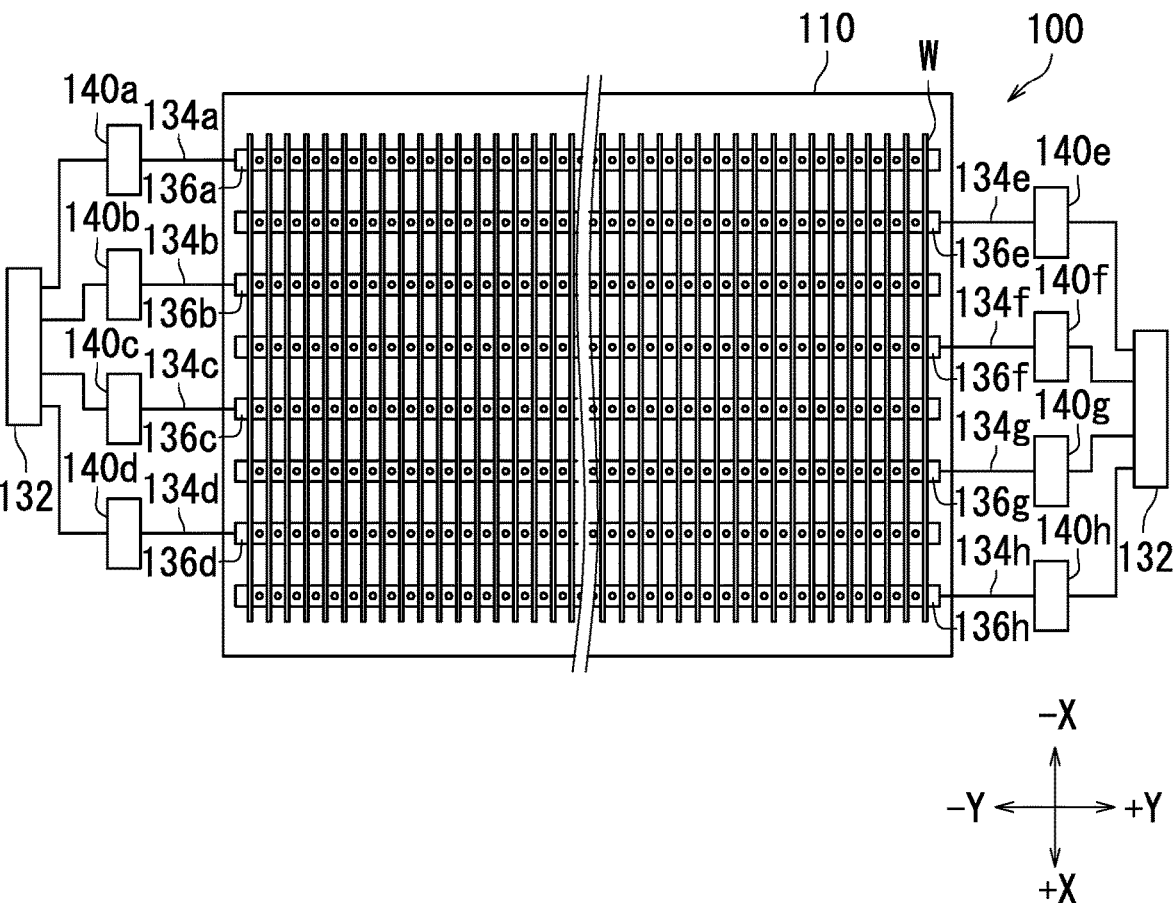

FIG. 11 is a schematic top view of a substrate processing apparatus according to the embodiment.

Figure 12:
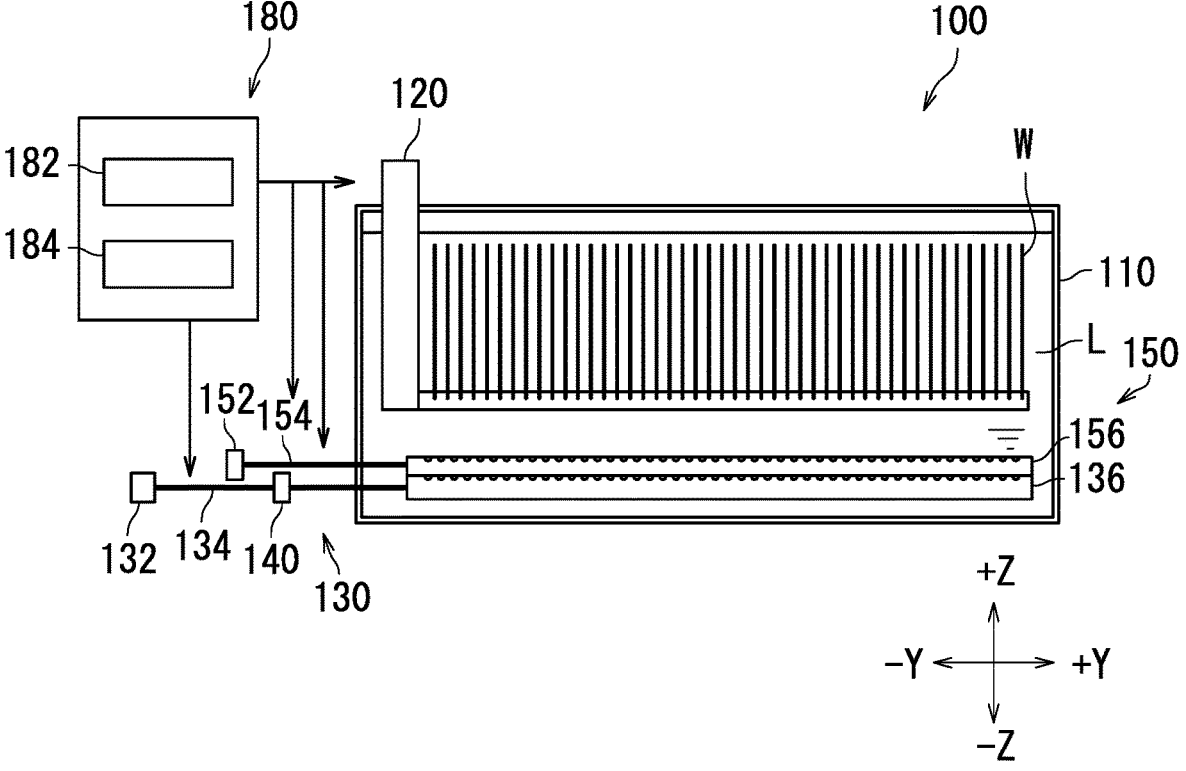

FIG. 12 is a schematic view of a substrate processing apparatus according to the embodiment.

Figures 13A, 13B:
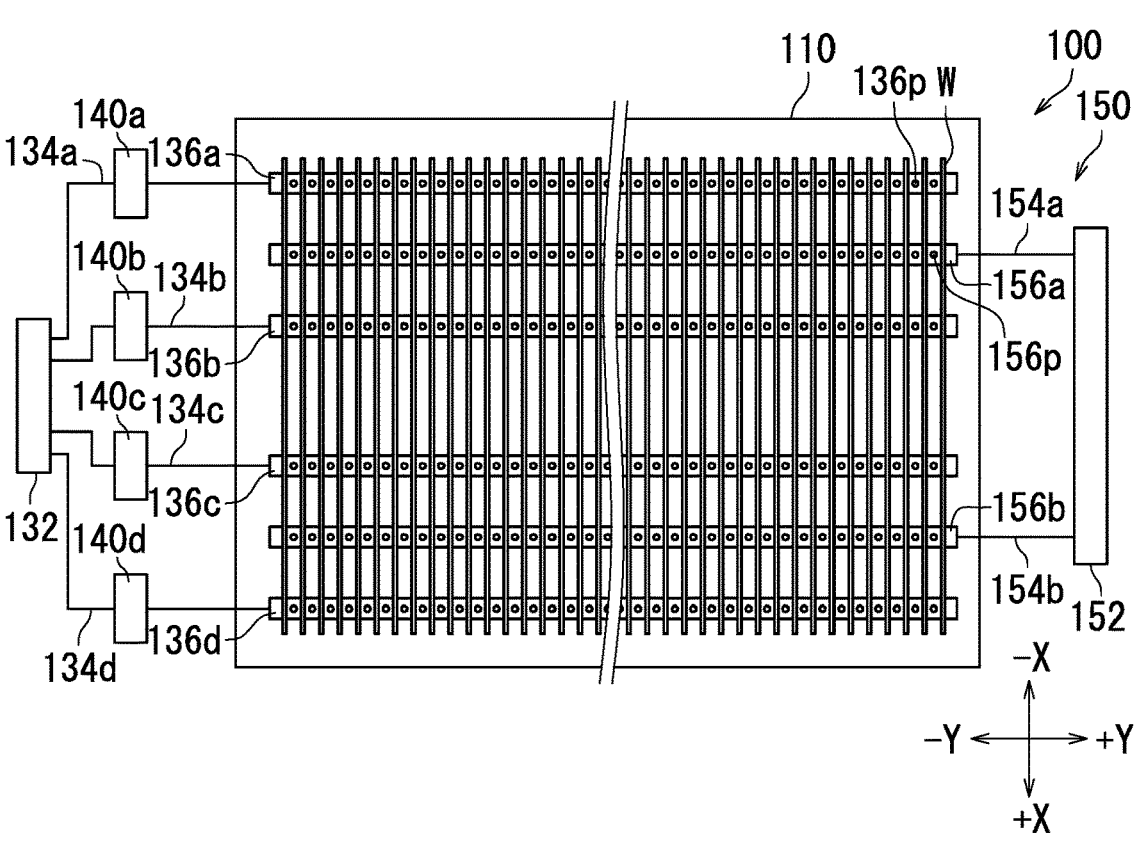

FIG. 13A is a schematic top view of a substrate processing apparatus according to the embodiment, and FIG. 13B is a schematic view of the substrate processing apparatus.

Figure 14A:
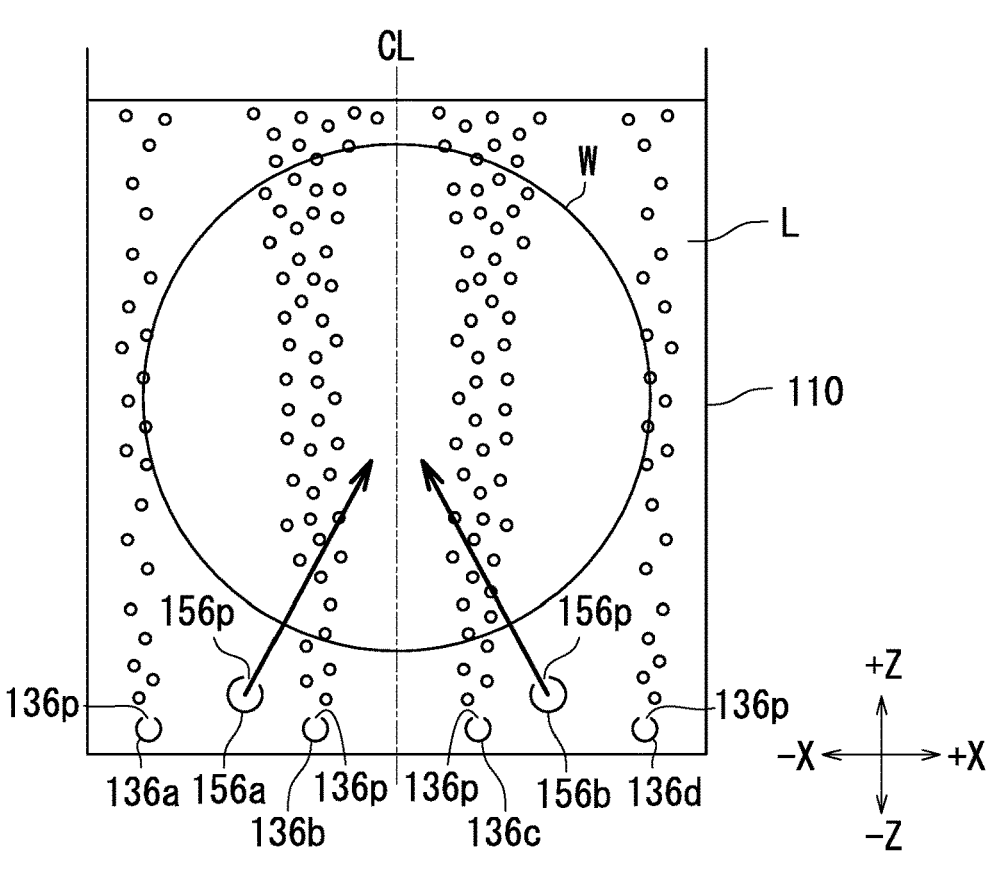
Figure 14B:
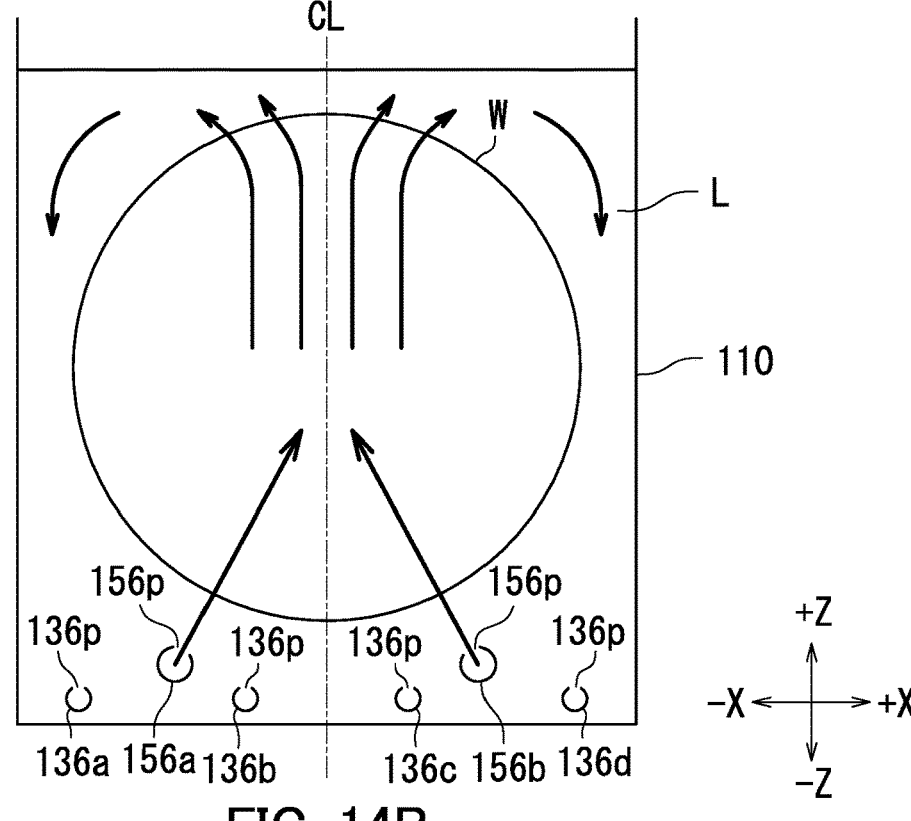

FIG. 14A is a schematic view illustrating bubbles generated when a plurality of gas supply pipes in a substrate processing apparatus according to the embodiment are supplied with their respective gases at an equal flow rate, and FIG. 14B is a schematic view illustrating a flow of a processing liquid in the substrate processing apparatus.

Figures 15A, 15B:
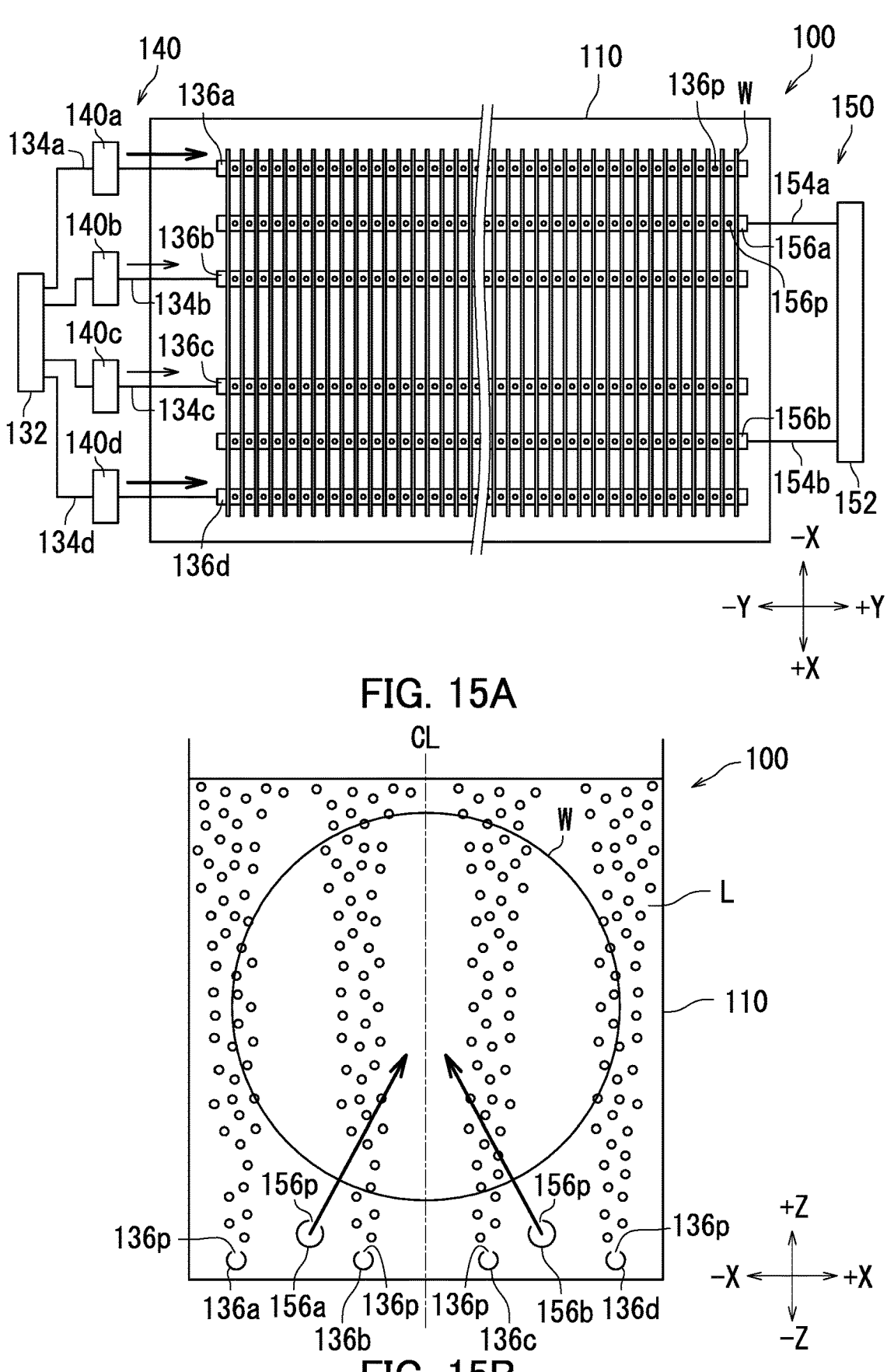

FIG. 15A is a schematic top view of a substrate processing apparatus according to the embodiment, and FIG. 15B is a schematic view illustrating bubbles generated when a plurality of gas supply pipes in the substrate processing apparatus are supplied with gases at different flow rates.

Figure 16:
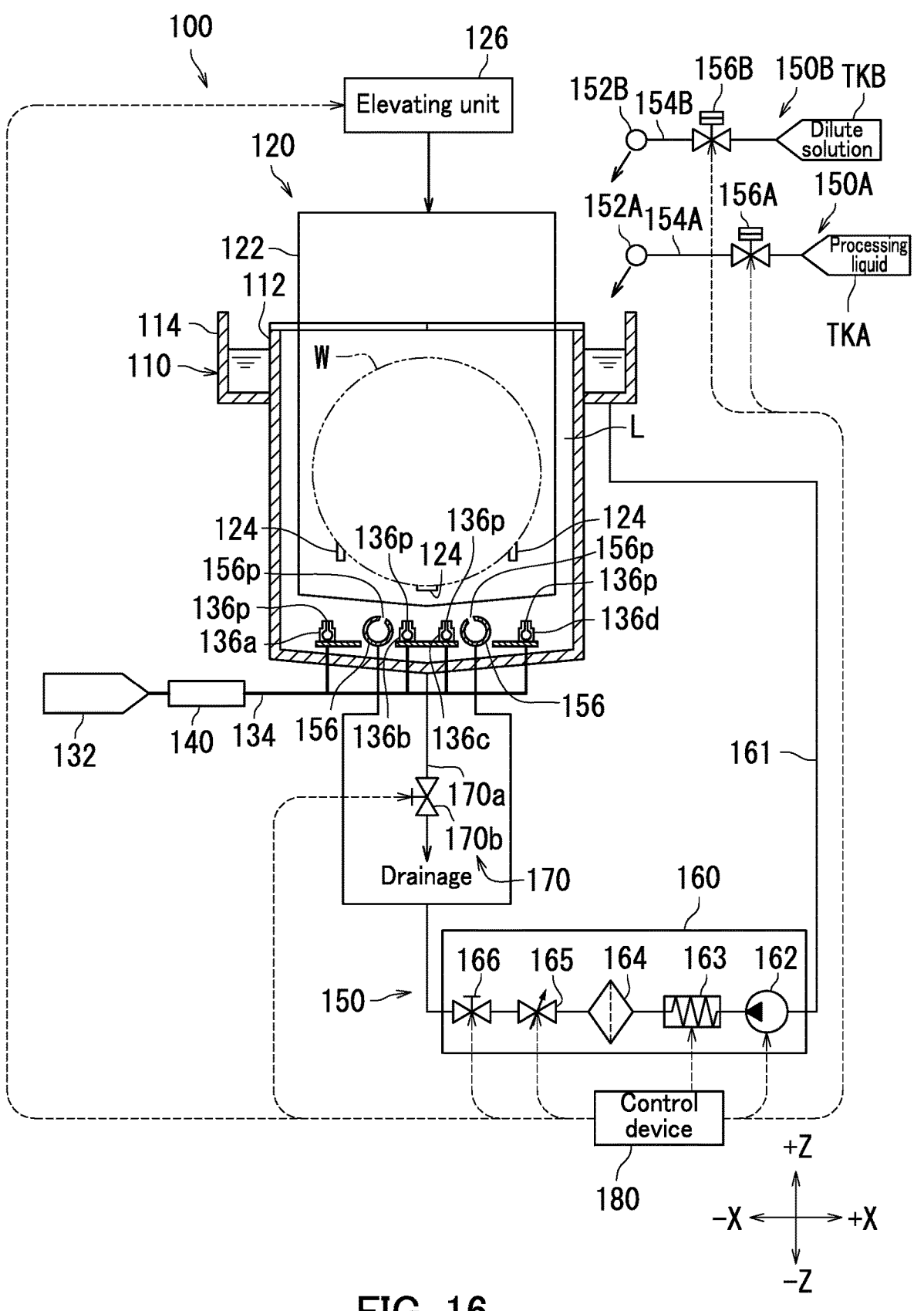

FIG. 16 is a schematic view of a substrate processing apparatus according to the embodiment.

DETAILED DESCRIPTION

Substrate processing apparatuses and substrate processing methods according to an embodiment of the present disclosure will hereinafter be described with reference to the accompanying drawings. In the drawings, the same or corresponding elements are assigned the same reference signs, and descriptions thereof are not repeated. In the present specification, X-axis, Y-axis and Z-axis that are orthogonal to each other may be described to facilitate understanding of the present disclosure. Typically, the X-axis and Y-axis are parallel to a horizontal direction, and the Z-axis is parallel to a vertical direction. Further, in the present specification, x-axis, y-axis and z-axis that are orthogonal to each other may be described to facilitate understanding of the present disclosure. Typically, the x-axis and y-axis extend parallel to a substrate or a main surface of the substrate, and the z-axis extends in the normal direction of the substrate or the main surface of the substrate.

Figures 1A, 1B:
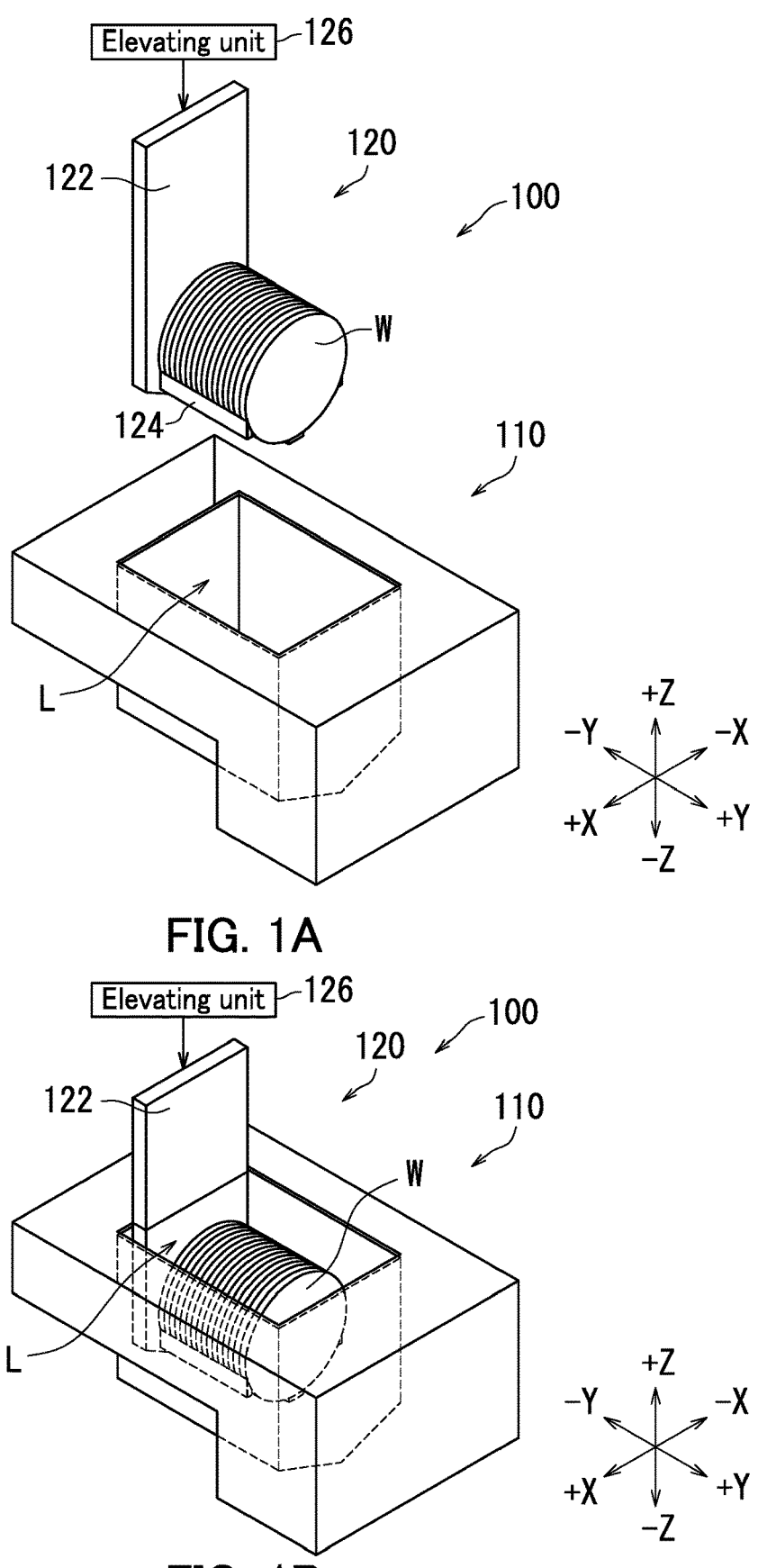
FIGS. 1A and 1B are schematic perspective views of a substrate processing apparatus according to an embodiment.

A substrate processing apparatus 100 according to an embodiment of the present disclosure will be described with reference to FIGS. 1A and 1B. FIGS. 1A and 1B are schematic perspective views of the substrate processing apparatus 100 according to the embodiment. FIG. 1A is a schematic perspective view before substrates W are immersed in a processing liquid L in a processing tank 110. FIG. 1B is a schematic perspective view after the substrates W are immersed in the processing liquid L in the processing tank 110.

The substrate processing apparatus 100 processes the substrates W. The substrate processing apparatus 100 may process the substrates W by applying, to the substrates W, at least one of processes that include an etching process, a surface finishing process, a character imparting process, a treatment film forming process, and a film removing and cleaning process for at least partial removal and cleaning of (a) films.

Each substrate W has a thin plate shape. Typically, each substrate W has a substantially thin disk shape. Examples of each substrate W include a semiconductor wafer, a substrate for liquid crystal display, a substrate for plasma display, a substrate for Field Emission Display (FED), a substrate for optical disc, a substrate for magnetic disk, a substrate for magneto-optical disk, a photomask substrate, a ceramic substrate, and a substrate for solar battery.

The substrate processing apparatus 100 processes the substrates W with the processing liquid L. At least one of the processes that include the etching process, the surface finishing process, the character imparting process, the treatment film forming process, and the film removing and cleaning process is applied to the substrates W by using the processing liquid L.

The substrate processing apparatus 100 collectively processes such a plurality of substrates W with the processing liquid L. Note that the substrate processing apparatus 100 may process a large number of substrates W by a predetermined number with the processing liquid L. The predetermined number is an integer of 1 or more. Here, the substrate processing apparatus 100 processes the plurality of substrates W together.

For example, the substrate processing apparatus 100 applies an etching process of a silicone oxide film ($SiO_2$ film) and a silicon nitride film (SiN film) to a surface, on a pattern formation side, of each substrate W made of a silicon substrate. In such an etching process, either the silicon oxide film or the silicon nitride film is removed from the surface of each substrate W.

The processing liquid L contains phosphoric acid ($H_3PO_4$). The processing liquid L contains, for example an aqueous phosphoric acid solution, a liquid containing an additive in an aqueous phosphoric acid solution, a mixed acid containing phosphoric acid, or a mixed acid containing phosphoric acid and an additive. For example, the silicon nitride film (SiN film) is removed from the surface of each substrate W with the processing liquid L, namely a solution (hereinafter, referred to as a "phosphoric acid liquid") at about 157° C. in which approximately 89% by mass of phosphoric acid ($H_3PO_4$) and approximately 11% by mass of water (deionized water) are mixed. In other words, a high temperature, high acid concentration solution with no impurities is employed as the processing liquid L that dissolves silicon (Si4+). Note that the type of the processing liquid L is not particularly limited as long as the substrates W can be processed. Further, the temperature of the processing liquid L is not particularly limited.

The substrate processing apparatus 100 includes the processing tank 110 and a substrate holding section 120. The processing tank 110 stores the processing liquid L for processing the substrates W.

The substrate holding section 120 holds the substrates W. A normal direction of a main surface of each substrate W held by the substrate holding section 120 is parallel to the Y-axis. The plurality of substrates W are aligned in a row along the Y-axis. In other words, the plurality of substrates W are aligned substantially parallel in the horizontal direction. The normal of the plurality of substrates W extends along the Y-axis, and each of the plurality of substrates W spreads along the X-axis and the Z-axis. The substrate holding section 120 moves the substrates W while holding the substrates W. For example, the substrate holding section 120 moves vertically upward or downward in the vertical direction while holding the substrates W.

Typically, the substrate holding section 120 holds the plurality of substrates W together. Here, the plurality of substrates W form a substrate row aligned in a row along the Y-axis. Therefore, the substrate holding section 120 holds the plurality of substrates W arranged as the substrate row. Note that the substrate holding section 120 may hold only one substrate W.

Specifically, the substrate holding section 120 includes a lifter. The substrate holding section 120 moves vertically upward or downward while holding the plurality of substrates W. The substrate holding section 120 moves vertically downward, so that the plurality of substrates W held by the substrate holding section 120 are immersed in the processing liquid L stored in the processing tank 110.

In FIG. 1A, the substrate holding section 120 is located above the processing tank 110. The substrate holding section 120 descends vertically downward (Z-axis) while holding the plurality of substrates W. As a result, the plurality of substrates W are put into the processing tank 110.

As illustrated in FIG. 1B, when the substrate holding section 120 descends into the processing tank 110, the plurality of substrates W are immersed in the processing liquid L in the processing tank 110. The substrate holding section 120 immerses, in the processing liquid L stored in the processing tank 110, the plurality of substrates W aligned at predetermined intervals.

The substrate holding section 120 further includes a body plate 122 and holding rods 124. The body plate 122 is a plate extending in the vertical direction (Z-axis). The holding rods 124 extend in the horizontal direction (Y-axis) from one main surface of the body plate 122. In FIGS. 1A and 1B, three holding rods 124 extend horizontally from the one main surface of the body plate 122. The plurality of holding rods 124 are in contact with the lower edge of each substrate W, whereby the plurality of substrates W aligned at predetermined intervals are held in that state and in an upright posture (vertical posture) by the plurality of holding rods 124.

The substrate holding section 120 may further include an elevating unit 126. The elevating unit 126 moves the body plate 122 up and down between a processing position (position illustrated in FIG. 1B) where the plurality of substrates W held by the substrate holding section 120 are located in the processing tank 110 and a retracted position (position illustrated in FIG. 1A) where the plurality of substrates W held by the substrate holding section 120 are located above the processing tank 110. Therefore, the body plate 122 is moved to the processing position by the elevating unit 126, so that the plurality of substrates W held by the holding rods 124 are immersed in the processing liquid L.

Figure 2:
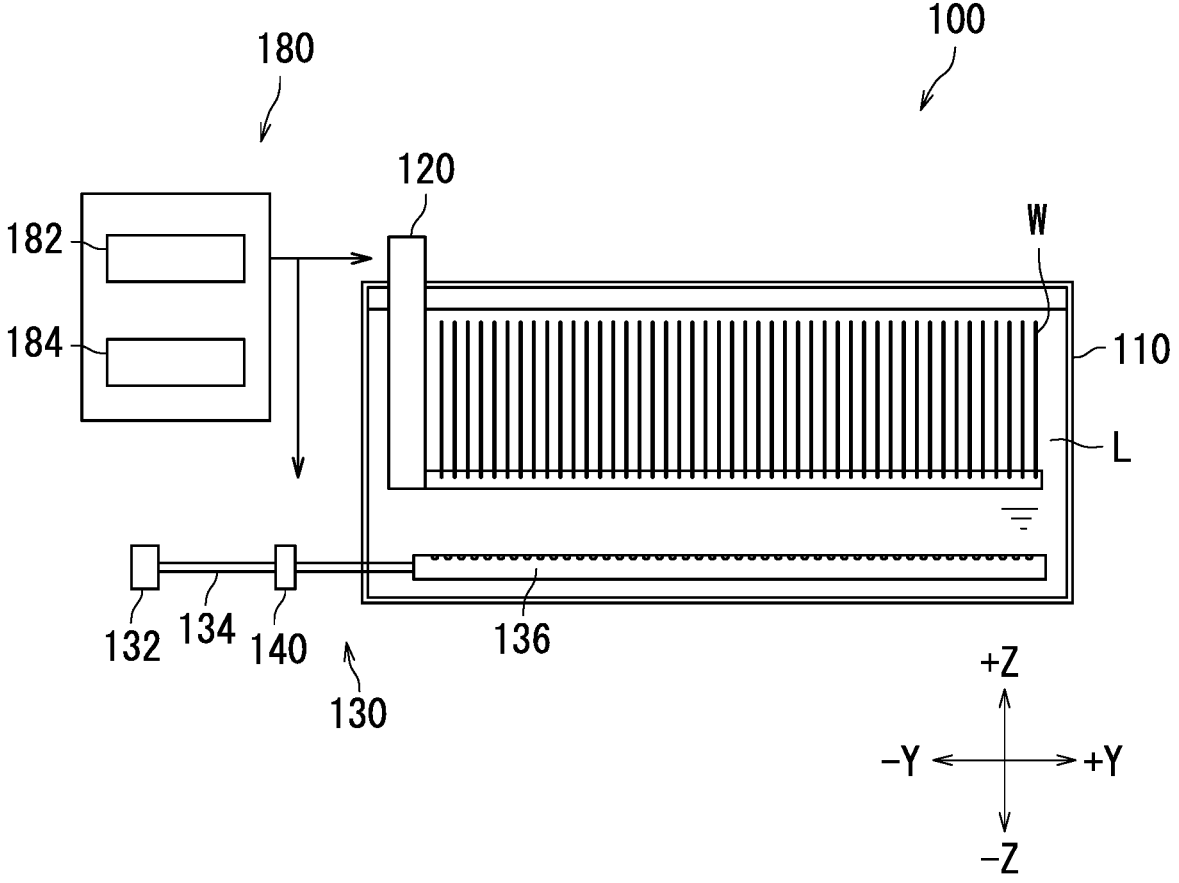
FIG. 2 is a schematic view of a substrate processing apparatus according to the embodiment.

Next, a substrate processing apparatus 100 according to the embodiment will be described with reference to FIGS. 1A, 1B and 2. FIG. 2 is a schematic view of the substrate processing apparatus 100.

As illustrated in FIG. 2, the substrate processing apparatus 100 further includes a gas supply section 130 and a control device 180. The gas supply section 130 supplies a gas to a processing tank 110. Specifically, the gas supply section 130 supplies the gas to a processing liquid L stored in the processing tank 110. The gas supply section 130 supplies the gas to the processing tank 110, so that the processing of the substrates W is promoted.

The gas supply section 130 supplies the gas to the processing tank 110, so that bubbles are formed in the processing liquid L. The bubbles formed in the processing liquid L float in the processing liquid L and reach the interface between gas (for example, air or a predetermined atmosphere) and the processing liquid L in the processing tank 110.

When the bubbles float in the processing liquid L, the bubbles come into contact with respective surfaces of the substrates W. In this case, since the phosphoric acid is agitated by the bubbles, the unevenness of silicon concentration in the phosphoric acid can be eliminated. Therefore, the etching uniformity can be improved.

The gas supply section 130 includes a gas supply source 132, gas supply pipes 134, and bubble generating pipes 136. The gas supply source 132 stores the gas. The gas is supplied from the gas supply source 132.

The gas supply pipes 134 connect the gas supply source 132 and the bubble generating pipes 136. The gas supplied from the gas supply source 132 flows through the gas supply pipes 134 to the bubble generating pipes 136.

The bubble generating pipes 136 are arranged in the processing tank 110. Typically, the bubble generating pipes 136 are arranged at the bottom side of the processing tank 110.

The gas supply section 130 may further include flow rate control mechanisms 140. The flow rate control mechanisms 140 are attached to the gas supply pipes 134. The flow rate control mechanisms 140 control a pressure and/or a flow rate of a gas flowing through each gas supply pipe 134. For example, the flow rate control mechanisms 140 control the flow rate of the gas flowing through each gas supply pipe 134. As an example, the flow rate control mechanisms 140 control the flow rate of the gas according to the process, with the pressure of the gas flowing through each gas supply pipe 134 being fixed at a constant level.

For example, each flow rate control mechanism 140 includes a nozzle or a regulating valve that opens and closes a flow path of a corresponding gas supply pipe 134. The flow control mechanism 140 may include a pressure gauge and a flow meter.

As described above, the bubble generating pipes 136 are arranged in the processing tank 110. On the other hand, the gas supply source 132 and the flow rate control mechanisms 140 are located outside the processing tank 110. Further, the gas supply pipes 134 are arranged outside the processing tank 110. Note that at least part of each gas supply pipe 134 may be arranged in the processing tank 110 to be connected to a corresponding bubble generating pipe 136 in the processing tank 110.

The control device 180 controls various operations of the substrate processing apparatus 100. Typically, the control device 180 controls the gas supply section 130. For example, the control device 180 controls the flow rate control mechanisms 140.

The control device 180 includes a controller 182 and storage 184. The controller 182 includes a processor. For example, the controller 182 includes a central processing unit (CPU). Alternatively, the controller 182 may have a general-purpose arithmetic unit.

The storage 184 stores data and a computer program(s). The data includes recipe data. The recipe data includes information indicating a plurality of recipes. Each recipe defines processing content and processing procedure of the substrates W.

The storage 184 includes main storage and auxiliary storage. For example, the main storage is a semiconductor memory. The auxiliary storage is, for example a semiconductor memory and/or a hard disk drive. The storage 184 may include removable media. The controller 182 executes the computer program stored in the storage 184 to execute a substrate processing operation.

The storage 184 stores a computer program describing a procedure in advance. The substrate processing apparatus 100 operates according to the procedure described in the computer program.

The controller 182 controls the gas supply section 130. The gas supply from the gas supply section 130 is controlled by the controller 182. Specifically, the controller 182 controls the start and stop of the gas supply by the gas supply section 130. Further, the controller 182 controls the flow rate control mechanisms 140 to control a flow rate of a gas supplied to each of the bubble generating pipes 136 in the processing tank 110. In one example, the controller 182 may control the nozzles, the regulating valves or the like provided in the gas supply pipes 134 outside the processing tank 110, thereby controlling the supply of respective gases to the bubble generating pipes 136.

The controller 182 also controls the elevating unit 126. According to the control by the controller 182, the body plate 122 moves up and down with respect to the processing liquid L in the processing tank 110.

Figure 3A:
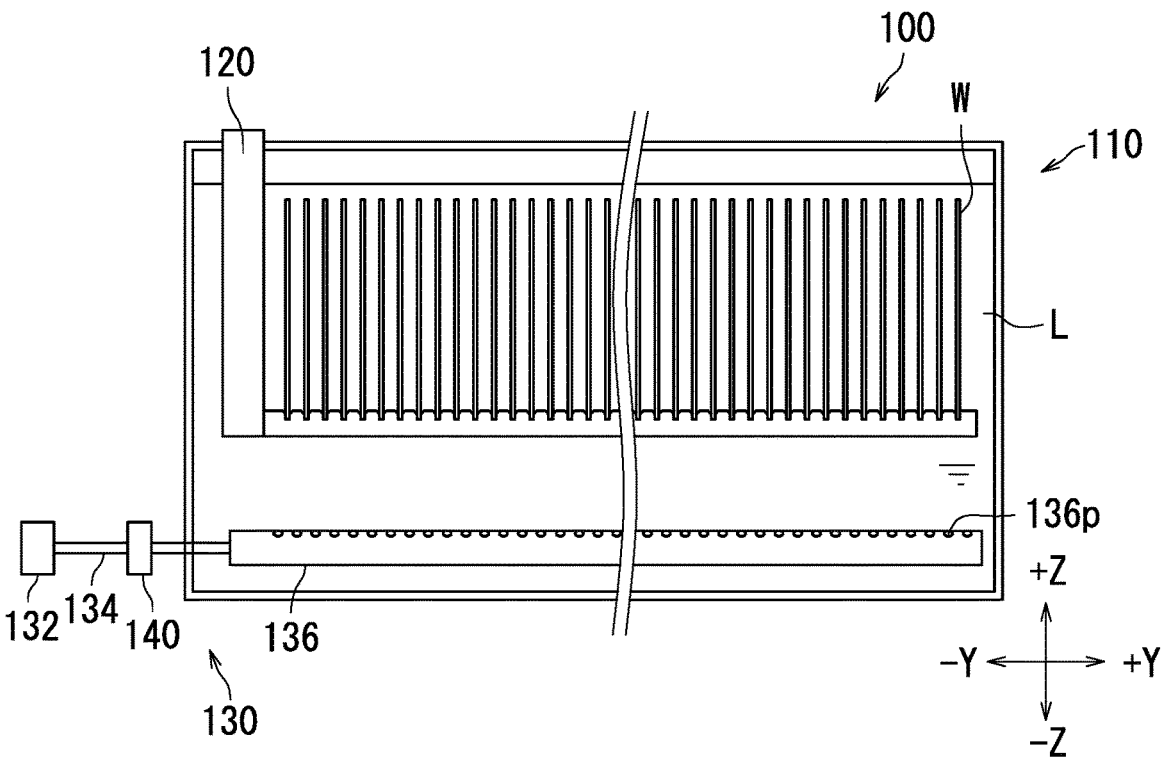
FIG. 3A is a schematic side view of a substrate processing apparatus according to the embodiment.
Figure 3B:
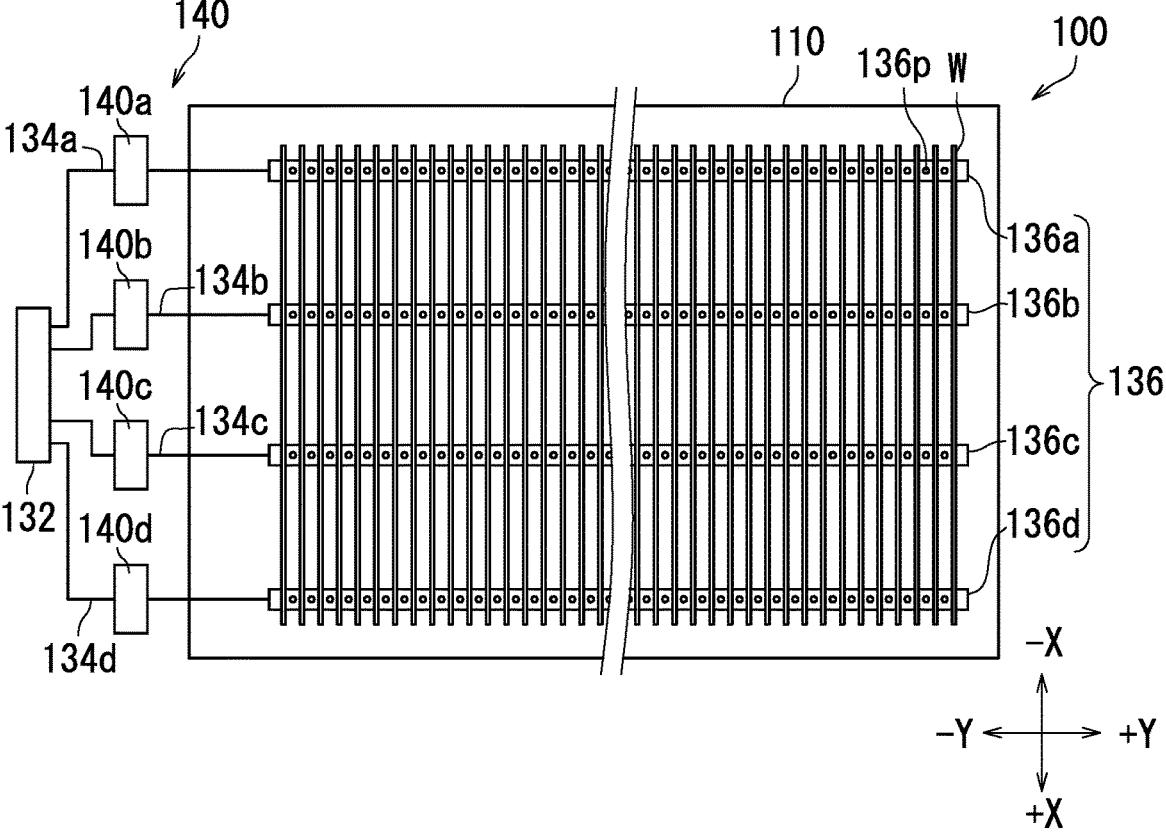
FIG. 3B is a schematic top view of the substrate processing apparatus according to the embodiment.

Next, a substrate processing apparatus 100 according to the embodiment will be described with reference to FIGS. 3A and 3B. FIG. 3A is a schematic side view of the substrate processing apparatus 100 according to the embodiment. FIG. 3B is a schematic top view of the substrate processing apparatus 100 according to the embodiment.

As illustrated in FIG. 3A, a substrate holding section 120 holds a plurality of substrates W aligned in a row along the Y-axis. The plurality of substrates W are aligned at equal intervals. For example, the distance between each adjacent substrates W is 2 mm or more and 20 mm or less.

Bubble generating pipes 136 are arranged below the substrates W held by the substrate holding section 120. Typically, the bubble generating pipes 136 are arranged at the bottom side of the processing tank 110. The bubble generating pipes 136 extend along the Y-axis.

Each bubble generating pipe 136 is provided with a plurality of openings 136p. In the bubble generating pipe 136, the plurality of openings 136p are aligned in a row. Intervals at which the plurality of openings 136p are aligned are the same as intervals at which the substrates W are aligned. Each opening 136p is located between corresponding adjacent substrates W in the alignment direction.

As illustrated in FIG. 3B, the bubble generating pipes 136 include a bubble generating pipe 136a, a bubble generating pipe 136b, a bubble generating pipe 136c, and a bubble generating pipe 136d. The bubble generating pipes 136a to 136d extend in parallel with each other. The bubble generating pipes 136a to 136d extend along the Y-axis. The bubble generating pipe 136a, the bubble generating pipe 136b, the bubble generating pipe 136c and the bubble generating pipe 136d are arranged in this order from the negative half side to the positive half side of the X-axis.

The bubble generating pipes 136a and 136d are arranged below outer regions of each substrate W along the X-axis. For example, the outer regions of each substrate W are regions, each of which is a region to the end of the substrate W from a position at a distance of 0.6 times the radius from the center of the substrate W in the horizontal direction. The bubble generating pipe 136a and 136d exemplify outer bubble generating pipes.

The bubble generating pipe 136b is arranged closer to the respective centers of the substrates W than the bubble generating pipe 136a in a plan view. The bubble generating pipe 136c is also arranged closer to the respective centers of the substrates W than the bubble generating pipe 136d in a plan view. Therefore, the bubble generating pipes 136b and 136c are arranged below the respective central regions of the substrates W. For example, the central region of each substrate W is a region from the center of the substrate W to a position at a distance of 0.6 times the radius from the center of the substrate W in the horizontal direction. The bubble generating pipes 136*b* and 136*c* exemplify inner bubble generating pipes.

The bubble generating pipes 136*a* to 136*d* are each provided with a plurality of openings 136*p*. Here, the plurality of openings 136*p* are equal in size and intervals.

The bubble generating pipes 136*a* to 136*d* have a similar configuration. Note that in the present specification, the bubble generating pipes 136*a* to 136*d* may be collectively referred to as the bubble generating pipes 136.

A gas supply source 132 is connected to each of gas supply pipes 134*a* to 134*d*. The gas supply pipe 134*a* connects the gas supply source 132 and the bubble generating pipe 136*a*. The gas supply pipe 134*b* connects the gas supply source 132 and the bubble generating pipe 136*b*. The gas supply pipe 134*c* connects the gas supply source 132 and the bubble generating pipe 136*c*. The gas supply pipe 134*d* connects the gas supply source 132 and the bubble generating pipe 136*d*. In this way, the gas supply pipes 134*a* to 134*d* connect the gas supply source 132 and the bubble generating pipes 136*a* to 136*d*, respectively.

A flow rate control mechanism 140*a* is installed in the gas supply pipe 134*a*. A flow rate control mechanism 140*b* is also installed in the gas supply pipe 134*b*. Similarly, flow rate control mechanisms 140*c* and 140*d* are installed in the gas supply pipes 134*c* and 134*d*, respectively. In this way, the flow rate control mechanisms 140*a* to 140*d* are installed in the gas supply pipes 134*a* to 134*d*, respectively.

Therefore, the bubble generating pipe 136*a* is supplied, from the gas supply source 132 through the gas supply pipe 134*a*, with a gas whose flow rate is controlled by the flow rate control mechanism 140*a*. The bubble generating pipe 136*b* is also supplied, from the gas supply source 132 through the gas supply pipe 134*b*, with a gas whose flow rate is controlled by the flow rate control mechanism 140*b*.

Similarly, the bubble generating pipe 136*c* is supplied, from the gas supply source 132 through the gas supply pipe 134*c*, with a gas whose flow rate is controlled by the flow rate control mechanism 140*c*. The bubble generating pipe 136*d* is also supplied, from the gas supply source 132 through the gas supply pipe 134*d*, with a gas whose flow rate is controlled by the flow rate control mechanism 140*d*.

The flow rates of the gases (gas flow rates) to be supplied to the bubble generating pipes 136*a* to 136*d* can be controlled by the flow rate control mechanisms 140*a* to 140*d*, respectively. The flow rate control mechanisms 140*a* to 140*d* enable the bubble generating pipes 136*a* to 136*d* to be supplied with their respective gases at an equal flow rate. Alternatively, the flow rate control mechanisms 140*a* to 140*d* enable the bubble generating pipes 136*a* to 136*d* to be supplied with their respective gases at different flow rates.

Note that here, the bubble generating pipes 136*a* to 136*d* are supplied with their respective gases from the same gas supply source 132. However, the bubble generating pipes 136*a* to 136*d* may be supplied with their respective gases from different gas supply sources. In this case, the bubble generating pipes 136*a* to 136*d* may be supplied with their respective gases at a predetermined flow rate from gas supply sources 132.

Figure 4A:
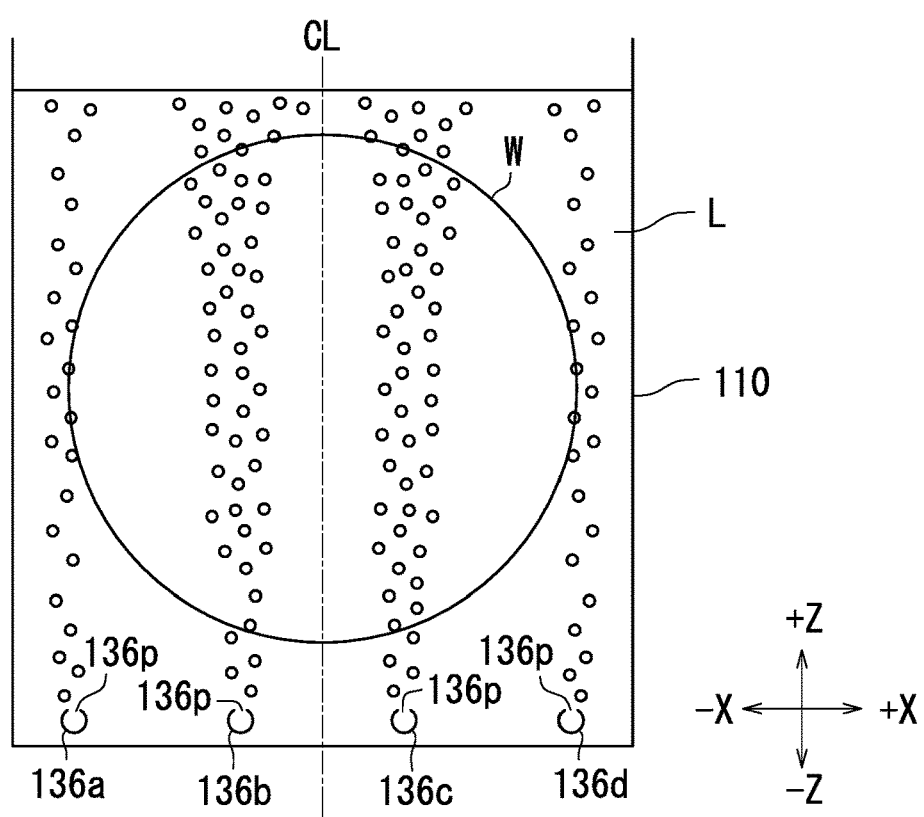
FIG. 4A is a schematic view illustrating bubbles generated when a plurality of bubble generating pipes in a substrate processing apparatus according to the embodiment are supplied with their respective gases at an equal flow rate.
Figure 4B:
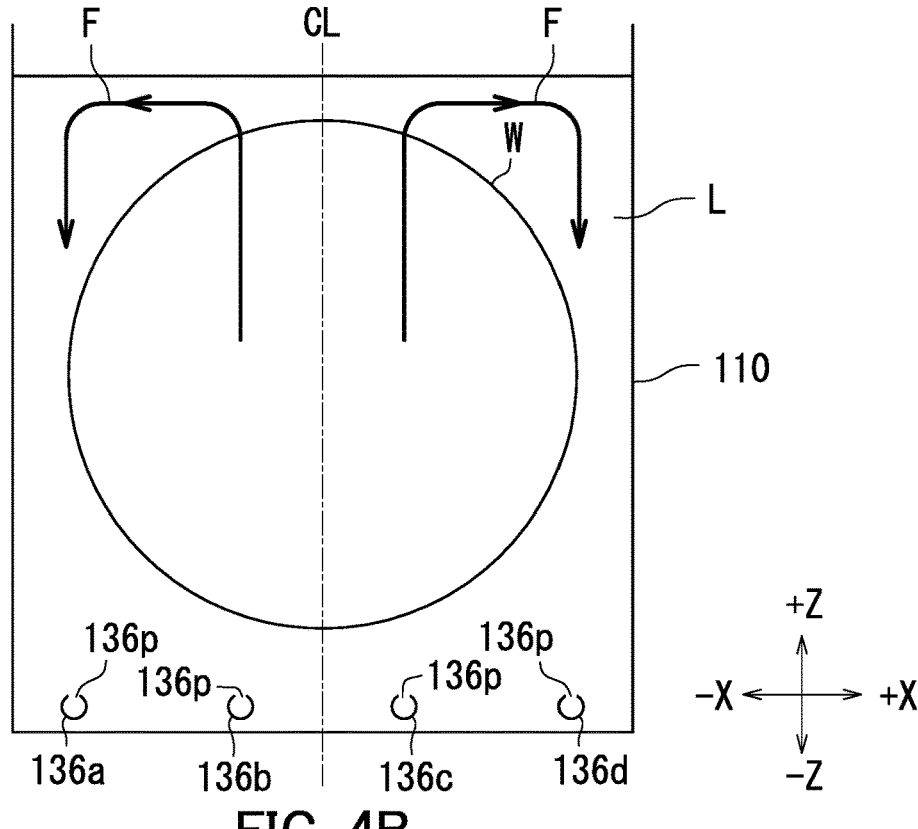
FIG. 4B is a schematic view illustrating flows of a processing liquid in the substrate processing apparatus.

Next, a substrate processing apparatus 100 according to the embodiment will be described with reference to FIGS. 1A to 4B. FIGS. 4A and 4B are schematic views of the substrate processing apparatus 100. FIG. 4A illustrates bubbles generated when a plurality of bubble generating pipes 136 are supplied with their respective gases at an equal flow rate, in the substrate processing apparatus 100. FIG. 4B illustrates flows of a processing liquid L while the bubbles are generated, in the substrate processing apparatus 100 according to the embodiment. Here, flow rate control mechanisms 140*a* to 140*d* enables bubble generating pipes 136*a* to 136*d* to be supplied with their respective gases at an equal flow rate. Further, FIGS. 4A and 4B illustrate virtual center lines CL extending through respective centers of substrates W in the vertical direction.

As illustrated in FIG. 4A, the bubble generating pipes 136*a* to 136*d* are supplied with the gases, and then each generate bubbles in the processing liquid L. The bubble generating pipes 136*a* to 136*d* each discharge the gases into the processing liquid L in the processing tank 110, so that the bubbles are generated in the processing liquid L. The bubbles generated in the processing liquid L float in the processing liquid L and reach the interface between gas (for example, air or a predetermined atmosphere) and the processing liquid L in the processing tank 110.

While the bubbles float in the processing liquid L, the bubbles come into contact with respective surfaces of the substrates W. In this case, since the phosphoric acid is agitated by the bubbles, the unevenness of the silicon concentration in the phosphoric acid is eliminated, so that the etching uniformity can be improved.

The amount of bubbles generated from the bubble generating pipe 136*a* is smaller than the amount of bubbles generated from the bubble generating pipe 136*b*. Similarly, the amount of bubbles generated from the bubble generating pipe 136*d* is smaller than the amount of bubbles generated from the bubble generating pipe 136*c*.

FIG. 4B illustrates flows F of the processing liquid L by the bubbles generated from the bubble generating pipes 136*a* to 136*d*. When the bubbles float up, the processing liquid L flows to the interface between the gas (for example, air or a predetermined atmosphere) and the processing liquid L in the processing tank 110, and then flows toward positive and negative half sides of the X-axis. The processing liquid L subsequently forms downward flows directed downward along the side walls of the processing tank 110 on the positive and negative half sides of the X-axis.

Therefore, the outer bubble generating pipes 136*a* and 136*d* in the processing tank 110 are strongly affected by the downward flows of the processing liquid L from up to down in the processing tank 110, compared with the inner bubble generating pipes 136*b* and 136*c* in the processing tank 110. Therefore, even if the bubble generating pipes 136*a* to 136*d* are supplied with their respective gases at an equal flow rate, the etching amount by the bubbles generated from the bubble generating pipes 136*a* to 136*d* may not be uniform. For example, the amount of bubbles generated from the outer bubble generating pipes 136*a* and 136*d* in the processing tank 110 may be smaller than the amount of bubbles generated from the inner bubble generating pipes 136*b* and 136*c* in the processing tank 110.

Figure 5A:
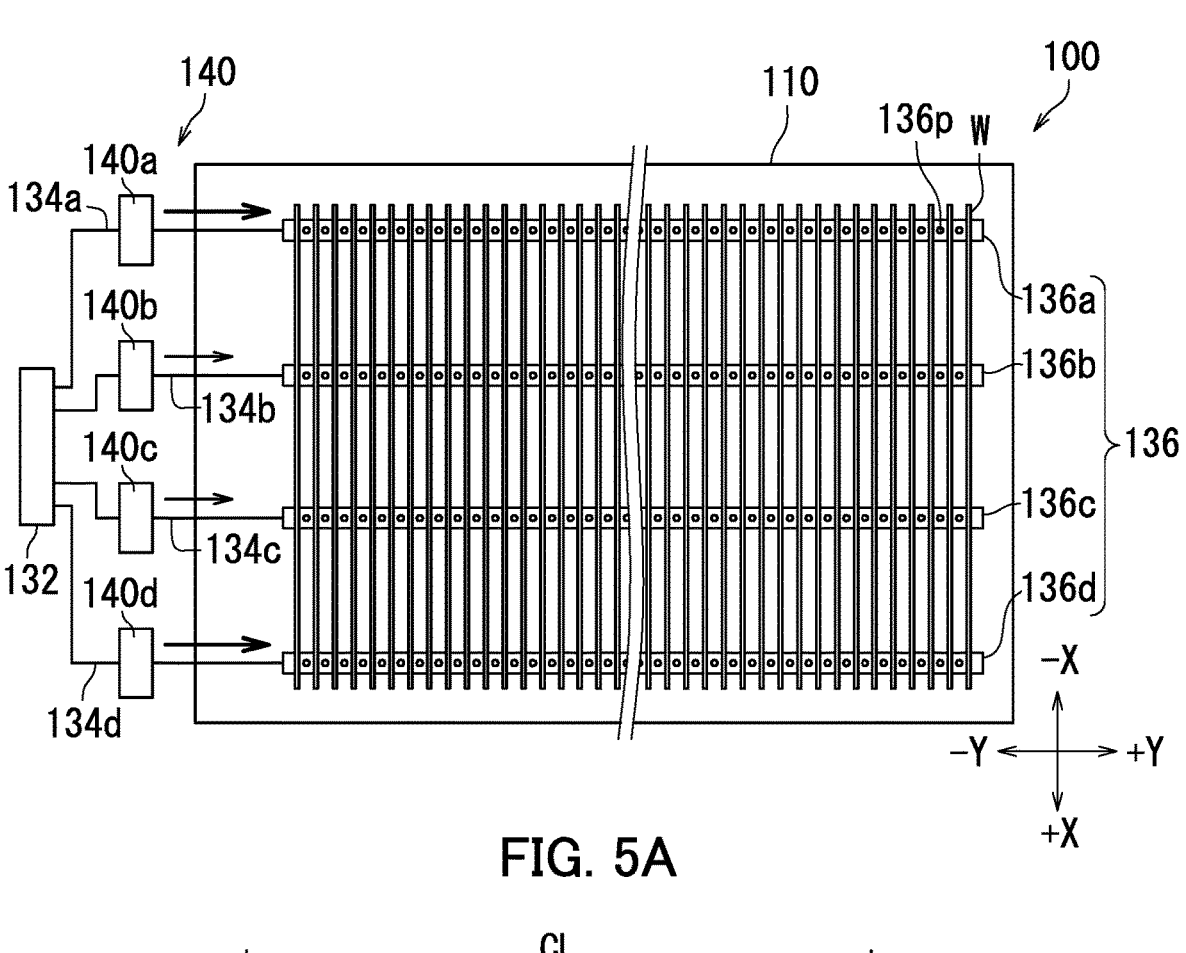
FIG. 5A is a schematic top view of a substrate processing apparatus according to the embodiment.
Figure 5B:
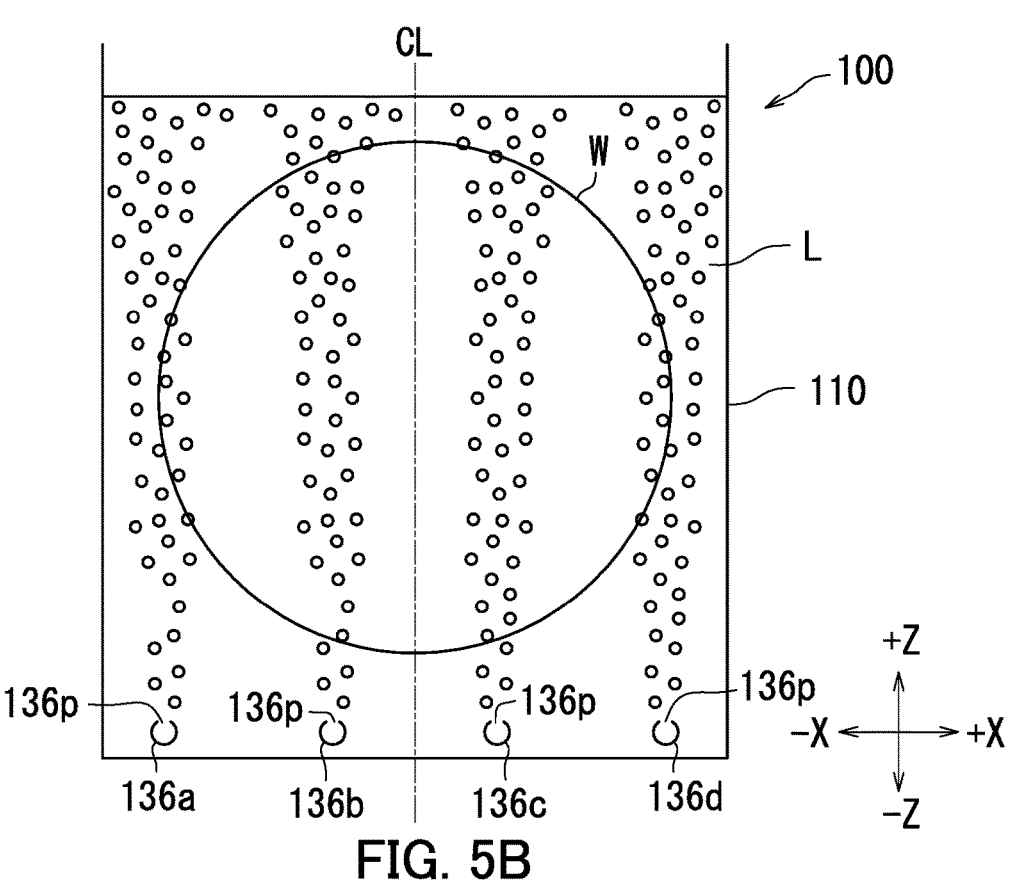
FIG. 5B is a schematic view illustrating bubbles generated when a plurality of bubble generating pipes in the substrate processing apparatus are supplied with their respective gases at different flow rates.

Next, a substrate processing apparatus 100 according to the embodiment will be described with reference to FIGS. 5A and 5B. FIG. 5A is a schematic top view of the substrate processing apparatus 100 according to the embodiment. FIG. 5B is a schematic view of the substrate processing apparatus 100 according to the embodiment, in which a plurality of bubble generating pipes 136 are supplied with their respective gases at different flow rates, thereby each generating bubbles.

As illustrated in FIG. 5A, flow rate control mechanisms 140*a* to 140*d* perform control so that bubble generating pipes 136*a* to 136*d* are supplied with their respective gases at different flow rates. Specifically, the flow rate control mechanisms 140*a* and 140*b* control a flow rate of a gas flowing through each of gas supply pipes 134a and 134b so that the flow rate of the gas supplied to the bubble generating pipe 136a is larger than the flow rate of the gas supplied to the bubble generating pipe 136b. Further, the flow rate control mechanisms 140c and 140d control a flow rate of a gas flowing through each of gas supply pipes 134c and 134d so that the flow rate of the gas supplied to the bubble generating pipe 136d is larger than the flow rate of the gas supplied to the bubble generating pipe 136c.

As a result, the flow rates of the gases supplied to the outer bubble generating pipes 136a and 136d in the processing tank 110 are larger than the flow rates of the gases supplied to the inner bubble generating pipes 136b and 136c in the processing tank 110.

As illustrated in FIG. 5B, the bubble generating pipes 136a to 136d are supplied with their respective gases, and then each generate bubbles in the processing liquid L. Here, the bubble generating pipes 136a to 136d each generate bubbles at almost an equal amount. Specifically, the bubble generating pipes 136a to 136d each generate bubbles having substantially the same size in the processing liquid L at almost the same frequency.

This configuration enables the bubble generating pipes 136a to 136d to be supplied with their respective gases at different flow rates so that the bubble generating pipes 136a to 136d can each generate bubbles at almost an equal amount.

Note that the upper limit of the flow rates of the gases supplied to the bubble generating pipes 136a to 136d is set so that the processing liquid L in the processing tank 110 does not overflow from the processing tank 110. For example, the upper limit of the flow rates of the gases supplied to the bubble generating pipes 136a to 136d is set based on the internal volume of the processing tank 110, the amount of the processing liquid L, the temperature of the processing liquid L, and the like. Further, the lower limit of the flow rates of the gases supplied to the bubble generating pipes 136a to 136d is set according to the presence or absence of bubbles generated from the bubble generating pipes 136a to 136d.

In the substrate processing apparatus 100 according to the embodiment, the flow rates of the gases supplied to the outer bubble generating pipes 136a and 136d in the processing tank 110 are made larger than the flow rates of the gases supplied to the inner bubble generating pipes 136b and 136c in the processing tank 110. This enables the bubble generating pipes 136a to 136d to each generate bubbles at almost an equal amount, thereby suppressing processing unevenness over respective surfaces of the substrates W.

Figure 6:
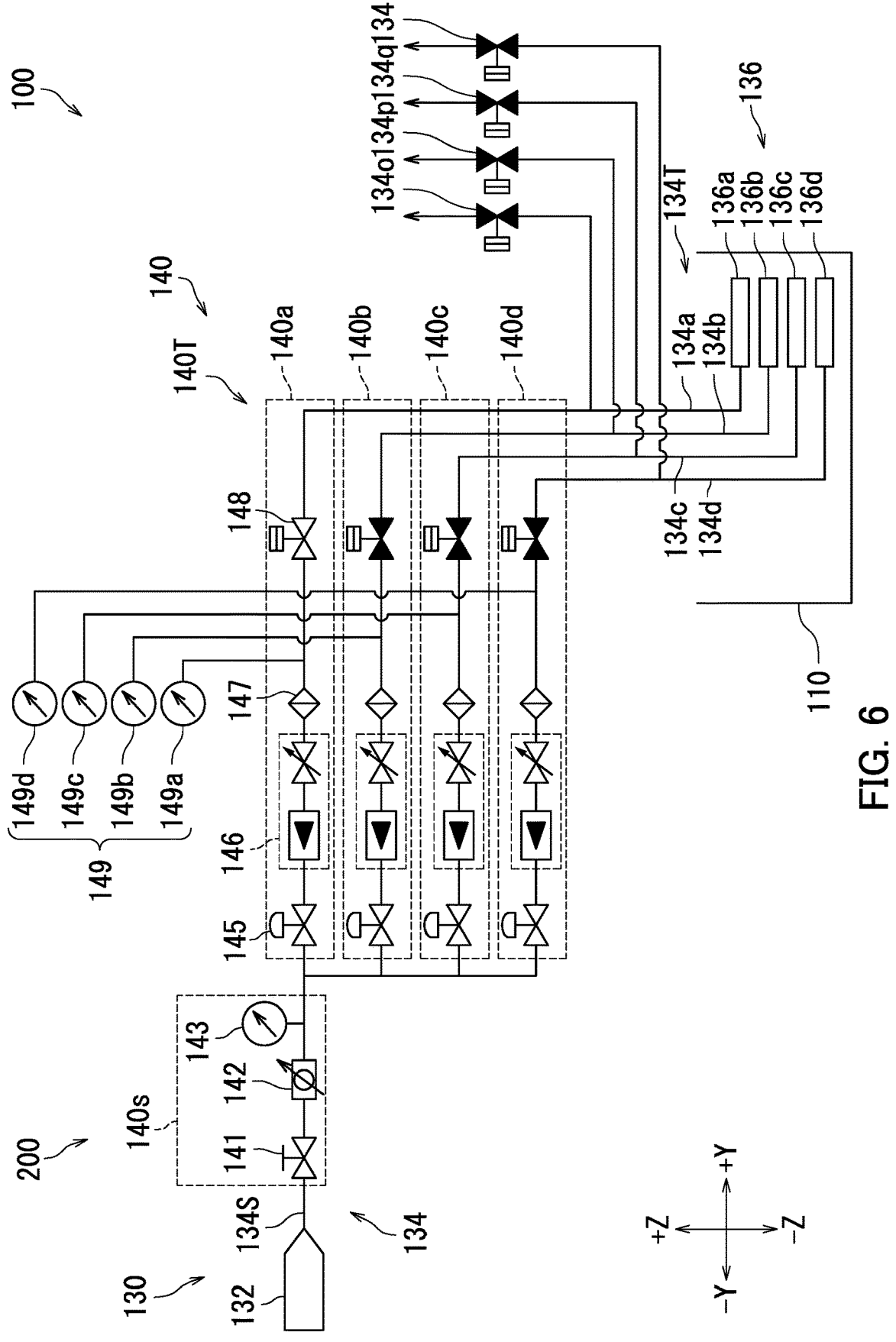
FIG. 6 is a schematic view of a substrate processing apparatus according to the embodiment.

Next, a substrate processing apparatus 100 according to the embodiment will be described with reference to FIG. 6. FIG. 6 is a schematic view of the substrate processing apparatus 100 according to the embodiment.

As illustrated in FIG. 6, a gas supply section 130 includes a gas supply source 132, gas supply pipes 134, bubble generating pipes 136, and flow rate control mechanisms 140. Here, bubble generating pipes 136a to 136d arranged in a processing tank 110 are supplied with their respective gases to each generate bubbles in a processing liquid L, so that a plurality of substrates W immersed in the processing liquid L are supplied with bubbles.

For example, the gas supply pipes 134 include a common pipe 134S and individual pipes 134T. The individual pipes 134T include gas supply pipes 134a to 134d.

The common pipe 134S connects the gas supply source 132 and the individual pipes 134T. Specifically, the upstream end of the common pipe 134S is connected to the gas supply source 132. The gas supply source 132 supplies a gas to the common pipe 134S. The downstream end of the common pipe 134S is connected to the upstream ends of the gas supply pipes 134a to 134d.

The downstream end of the gas supply pipe 134a is connected to the bubble generating pipe 136a. The downstream end of the gas supply pipe 134b is connected to the bubble generating pipe 136b. The downstream end of the gas supply pipe 134c is connected to the bubble generating pipe 136c. The downstream end of the gas supply pipe 134d is connected to the bubble generating pipe 136d. Therefore, the bubble generating pipes 136a to 136d are supplied with their respective gases from the gas supply source 132 through the common pipe 134S and the gas supply pipes 134a to 134d.

The flow rate control mechanisms 140 include a common control mechanism 140s and individual control mechanisms 140T. The individual control mechanisms 140T include flow rate control mechanisms 140a to 140d.

The common control mechanism 140s includes a valve 141, a regulator 142, and a pressure gauge 143. The valve 141, the regulator 142, and the pressure gauge 143 are arranged in the common pipe 134S in this order from the upstream side to the downstream side of the common pipe 134S. When the valve 141 is opened, a gas flows from the gas supply source 132 through the common pipe 134S. The regulator 142 adjusts the pressure of the gas passing through the common pipe 134S to a predetermined value. The pressure gauge 143 detects a pressure in the common pipe 134S. The pressure gauge 143 is connected between the regulator 142 and the individual pipes 134T.

The flow rate control mechanism 140a controls a flow rate of a gas supplied from the gas supply source 132. The bubble generating pipe 136a is supplied, through the gas supply pipe 134a, with the gas whose flow rate is controlled. For example, the flow control mechanism 140a includes an adjustment valve 145, a flow meter 146, a filter 147, and a valve 148. The adjustment valve 145, the flow meter 146, the filter 147 and the valve 148 are arranged in the gas supply pipe 134a in this order from the upstream side to the downstream side of the gas supply pipe 134a.

The adjustment valve 145 adjusts the opening degree to adjust a flow rate of a gas supplied to the bubble generating pipe 136a. The "flow rate" indicates, for example the amount of the gas passing therethrough a unit area per unit time. Specifically, the adjustment valve 145 includes a valve body (not illustrated) having a valve seat inside, a valve element that opens and closes the valve seat, and an actuator (not illustrated) that moves the valve element between an open position and a closed position.

The adjustment valve 145 adjusts the flow rate of the gas based on the measurement result by the flow meter 146. Note that the adjustment valve 145 may be an adjustment valve of a mass flow controller (MFC), for example.

The flow meter 146 measures the flow rate of the gas flowing through the gas supply pipe 134a. The filter 147 filters the gas flowing through the gas supply pipe 134a.

The valve 148 opens and closes the gas supply pipe 134a. Therefore, the valve 148 switches between start and stop of the supply of the gas from the gas supply pipe 134a to the bubble generating pipe 136a.

The flow rate control mechanism 140b controls a flow rate of a gas supplied from the gas supply source 132. The flow rate control mechanism 140c controls a flow rate of a gas supplied from the gas supply source 132. Similarly, the flow rate control mechanism 140d controls a flow rate of a gas supplied from the gas supply source 132. Each configuration of the flow rate control mechanisms 140_b_ to 140_d_ is the same as the configuration of the flow rate control mechanism 140_a_.

The substrate processing apparatus 100 illustrated in FIG. 6 further includes a plurality of pressure gauges 149. The plurality of pressure gauges 149 include a pressure gauge 149_a_, a pressure gauge 149_b_, a pressure gauge 149_c_, and a pressure gauge 149_d_.

The pressure gauge 149_a_ detects the pressures of the gas in the gas supply pipe 134_a_. The pressure gauge 149_b_ detects the pressure of the gas in the gas supply pipe 134_b_. The pressure gauge 149_c_ detects the pressure of the gas in the gas supply pipe 134_c_. The pressure gauge 149_d_ detects the pressure of the gas in the gas supply pipe 134_d_.

The substrate processing apparatus 100 further includes a plurality of exhaust mechanisms 134_o_, 134_p_, 134_q_, and 134_r_. The exhaust mechanism 134_o_ is connected to the gas supply pipe 134_a_. The exhaust mechanism 134_p_ is connected to the gas supply pipe 134_b_. The exhaust mechanism 134_q_ is connected to the gas supply pipe 134_c_. The exhaust mechanism 134_r_ is connected to the gas supply pipe 134_d_.

Each of the exhaust mechanisms 134_o_ to 134_r_ discharges the gas to the outside. Specifically, each of the exhaust mechanisms 134_o_ to 134_r_ includes an exhaust pipe and a valve. The valve is placed in the exhaust pipe. The valve opens and closes the exhaust pipe. One end of the exhaust pipe is connected to a corresponding gas supply pipe 134. When the valve opens, the gas is discharged outside from the gas supply pipe 134 through the exhaust pipe.

In this way, the flow rate of the gas flowing through each of the gas supply pipes 134_a_ to 134_d_ can be appropriately controlled. Therefore, the amount of bubbles generated from each of the bubble generating pipes 136_a_ to 136_d_ can be appropriately controlled.

As described above, the amount of bubbles generated from each of the bubble generating pipes 136_a_ to 136_d_ varies according to the flow rate of the gas flowing through each of the gas supply pipes 134_a_ to 134_d_. When the flow rate control mechanisms 140_a_ to 140_d_ control the flow rates of the gases flowing through the gas supply pipes 134_a_ to 134_d_, a control device 180 (FIG. 2) may control the flow rate control mechanisms 140_a_ to 140_d_ according to values preset in a control program. Alternatively, the control device 180 may supply the gases to the substrates W to be processed, measure the flow rates or pressures of the gases flowing through the gas supply pipes 134_a_ to 134_d_, and set the flow rates of the gases to flow through the gas supply pipes 134_a_ to 134_d_.

The flow rates of the gases flowing through the gas supply pipes 134_a_ to 134_d_ may also be controlled by imaging the bubbles generated in the processing tank 110.

Figure 7:
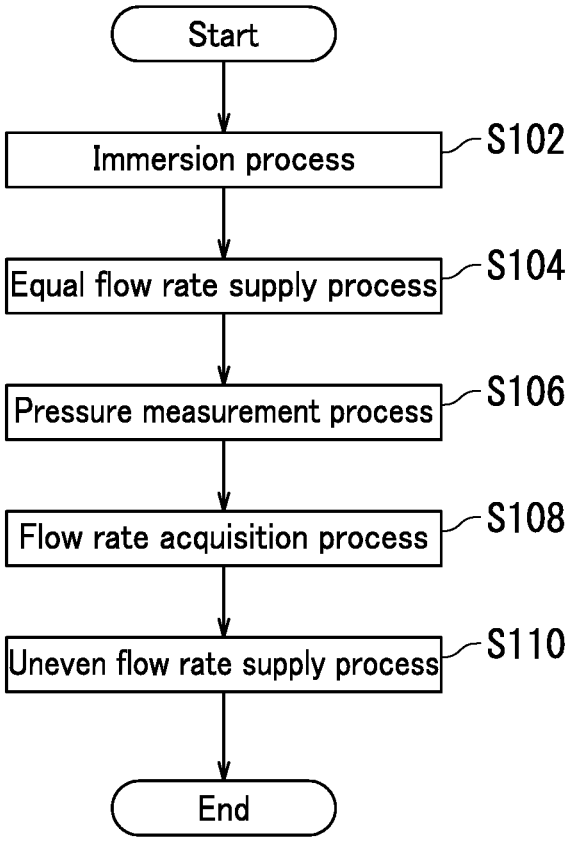
FIG. 7 is a flow chart according to a substrate processing method according to the embodiment.

Next, a substrate processing method according to the embodiment will be schematically described with reference to FIGS. 1A to 7. FIG. 7 is a flow chart according to the substrate processing method according to the embodiment.

As illustrated in FIG. 7, in step S102, a substrate holding section 120 descends substrates W in a processing tank 110 while holding the substrates W. As a result, the substrates W are immersed in a processing liquid L in the processing tank 110.

In step S104, flow rate control mechanisms 140_a_ to 140_d_ control flow rates of gases flowing through gas supply pipes 134_a_ to 134_d_ so that bubble generating pipes 136_a_ to 136_d_ are supplied with their respective gases at an equal flow rate (see equal flow rate supply process in FIGS. 4A and 4B).

In step S106, respective pressures of the gases in the gas supply pipes 134_a_ to 134_d_ are measured while the bubble generating pipes 136_a_ to 136_d_ are supplied with their respective gases at an equal flow rate (pressure measurement process). The pressures of the gases in the gas supply pipes 134_a_ to 134_d_ act as an index indicating the ease of generating bubbles in the processing tank 110. For example, the pressure gauges 149_a_ to 149_d_ illustrated in FIG. 6 measure the pressures of the gases in the gas supply pipes 134_a_ to 134_d_, respectively.

In step S108, the flow rates of the gases to flow through the gas supply pipes 134_a_ to 134_d_ are acquired according to the pressures of the gases in the gas supply pipes 134_a_ to 134_d_ (flow rate acquisition process). Typically, the control device 180 acquires the flow rates of the gases to flow through the gas supply pipes 134_a_ to 134_d_ based on the measurement results by the pressure gauges 149_a_ to 149_d_.

In step S110, based on the acquired flow rates, the flow rate control mechanisms 140_a_ to 140_d_ control the flow rates of the gases flowing through the gas supply pipes 134_a_ to 134_d_ so that the bubble generating pipes 136_a_ to 136_d_ are supplied with their respective gases at different flow rates (see uneven flow rate supply process in FIGS. 5A and 5B). In this case, the flow rate control mechanisms 140_a_ to 140_d_ control the flow rates of the gases flowing through the gas supply pipes 134_a_ to 134_d_ so that the flow rates of the gases supplied to the bubble generating pipes 136_a_ to 136_d_ are different. For example, the flow rate control mechanisms 140_a_ and 140_b_ control the flow rates of the gases flowing through the gas supply pipes 134_a_ and 134_b_ so that the flow rate of the gas supplied to the bubble generating pipe 136_a_ is larger than the flow rate of the gas supplied to the bubble generating pipe 136_b_. Further, the flow rate control mechanisms 140_c_ and 140_d_ control the flow rates of the gases flowing through the gas supply pipes 134_c_ and 134_d_ so that the flow rate of the gas supplied to the bubble generating pipe 136_d_ is larger than the flow rate of the gas supplied to the bubble generating pipe 136_c_. The bubble generating pipes 136_a_ to 136_d_ can each generate bubbles at almost an equal amount by making different the flow rates of the gases supplied to the bubble generating pipes 136_a_ to 136_d_. As described above, even if the conditions of the substrates W, the processing environment, and the processing liquid L are different, the bubble generating pipes 136_a_ to 136_d_ can each generate bubbles at almost an equal amount, so that the processing unevenness among the substrates W can be suppressed.

Note that the substrate processing apparatus 100 and the substrate processing method according to the embodiment are suitably used for manufacturing NAND devices.

Figures 8A, 8C:
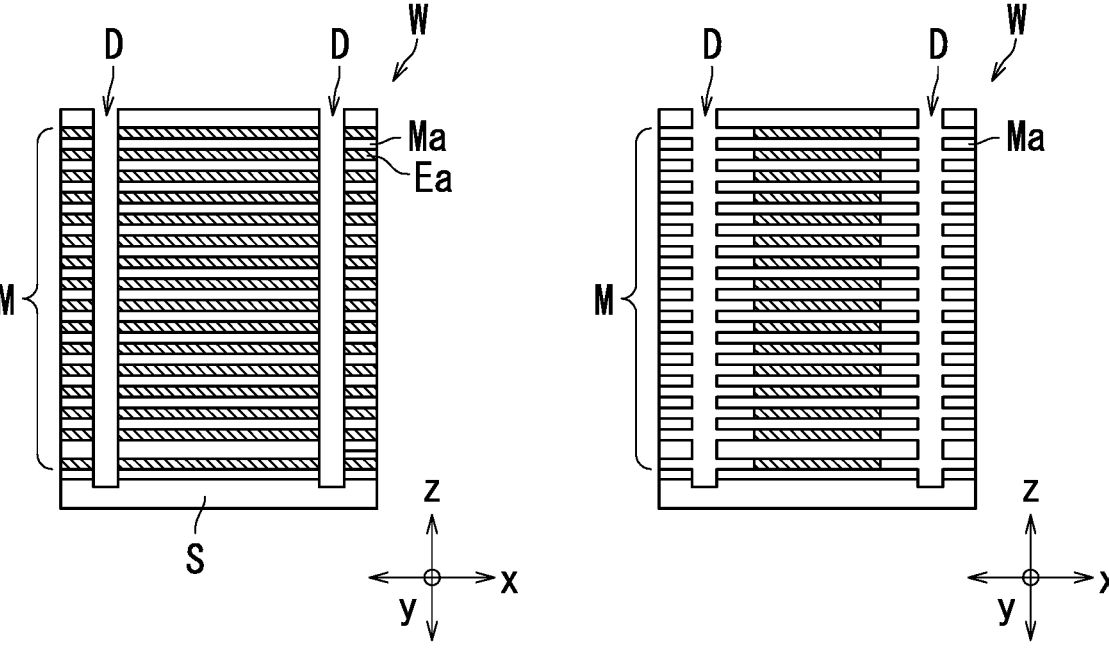
FIGS. 8A to 8C are schematic views illustrating changes of a substrate etched by a substrate processing method according to the embodiment.
Figure 8B:
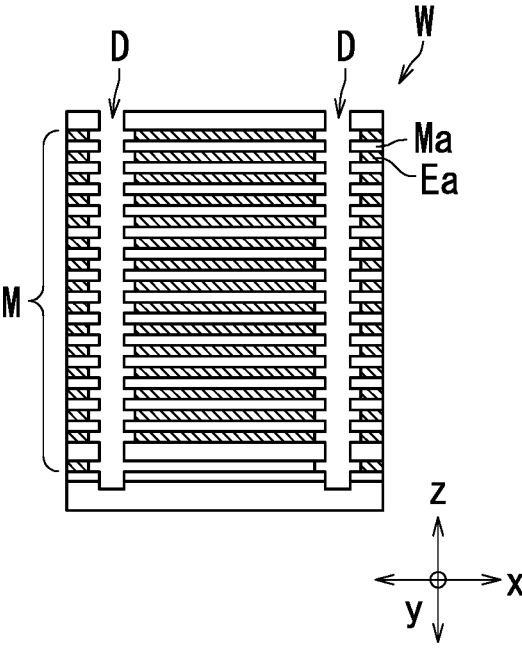

Next, a substrate processing method according to the embodiment will be schematically described with reference to FIGS. 1A to 8C. FIGS. 8A to 8C are schematic views of a substrate W processed by the substrate processing method according to the embodiment. FIGS. 8A to 8C are schematic enlarged cross-sectional views of the substrate W cut along the xz cross section.

A substrate W illustrated in FIG. 8A has a base material S and a laminated structure M. The laminated structure M is a three-dimensional laminated structure in which a plurality of layers including silicon nitride layers are arranged side by side through gaps D. Here, the substrate W is arranged so as to spread in the xy plane. The laminated structure M is located on the upper surface of the base material S. The laminated structure M extends from the upper surface of the base material S along the z-axis. The gaps D are formed in the laminated structure M. Here, the gaps D reach the base material S, thereby exposing part of the base material S.

The laminated structure M has a plurality of silicon oxide layers Ma and a plurality of silicon nitride layers Ea. The silicon oxide layers Ma and the silicon nitride layers Ea are alternately laminated. The silicon oxide layers Ma and the silicon nitride layers Ea are piled on the upper surface of the base material S.

As illustrated in FIG. 8B, the substrate W is processed with a processing liquid L in the substrate processing apparatus 100. For example, when the silicon nitride layers Ea of the substrate W are etched by phosphatizing, each silicon nitride layer Ea is partially removed.

As illustrated in FIG. 8C, the silicon nitride layers Ea are sufficiently removed from the laminated structure M by further phosphatizing, so that the silicon oxide layers Ma and the silicon nitride layers Ea that have not been etched by the processing liquid L remain in the laminated structure M. As described above, the silicon nitride layers Ea are etched from the substrate W by phosphatizing.

At this time, when bubbles are generated in the processing liquid L so that the bubbles come into contact with the entire surface of the substrate W, the bubbles promote the replacement of the processing liquid L on the surface of the substrate W. Therefore, processing unevenness for each substrate W can be suppressed.

In the substrate processing apparatus 100 illustrated in FIGS. 2 to 6, the bubble generating pipes 136a to 136d each supply bubbles to all the substrates W held by the substrate holding section 120, but the embodiment is not limited to this. Further, in the substrate processing apparatus 100 illustrated in FIGS. 2 to 6, the flow rate control mechanisms 140a to 140d control the flow rates of the gases supplied to the bubble generating pipes 136a to 136d, respectively, but the embodiment is not limited to this.

Next, a substrate processing apparatus 100 according to the embodiment will be described with reference to FIGS. 1A to 10B. FIGS. 9, 10A and 10B are schematic top views of their respective substrate processing apparatuses 100 according to the embodiment.

As illustrated in FIG. 9, bubble generating pipes 136a to 136h are arranged in a processing tank 110. The bubble generating tubes 136a to 136d are arranged at the negative half side of the Y-axis in the processing tank 110. The bubble generating tubes 136e to 136h are arranged at the positive half side of the Y-axis in the processing tank 110. At the negative half side of the Y-axis in the processing tank 110, the bubble generating pipes 136a to 136d are arranged in order at equal intervals from the negative half side to the positive half side of the X-axis. On the other hand, at the positive half side of the Y-axis in the processing tank 110, the bubble generating pipes 136e to 136h are arranged in order at equal intervals from the negative half side to the positive half side of the X-axis. The bubble generating pipes 136a, 136d, 136e, and 136h exemplify outer bubble generating pipes. The bubble generating pipes 136b, 136c, 136f, and 136g exemplify inner bubble generating pipes.

The bubble generating pipes 136a and 136e are aligned in a straight line at the negative half side of the X-axis in the processing tank 110. Further, the bubble generating pipes 136b and 136f are aligned in a straight line inside the bubble generating pipes 136a and 136e.

Similarly, the bubble generating pipes 136d and 136h are aligned in a straight line at the positive half side of the X-axis in the processing tank 110. Further, the bubble generating pipes 136c and 136g are aligned in a straight line inside the bubble generating pipes 136d and 136h.

The bubble generating pipes 136a and 136d exemplify first outer pipes. The bubble generating pipes 136e and 136h exemplify second outer pipes. The bubble generating pipes 136b and 136c exemplify first inner pipes. The bubble generating pipes 136f and 136g exemplify second inner pipes.

The bubble generating pipe 136a is supplied, through a gas supply pipe 134a, with a gas whose flow rate is controlled by a flow rate control mechanism 140a. Similarly, the bubble generating pipes 136b to 136h are supplied, through gas supply pipes 134b to 134h, with gases whose flow rates are controlled by flow rate control mechanisms 140b to 140h, respectively.

Here, two bubble generating pipes are aligned in a straight line. When viewed in a plan view, the boundary between the two bubble generating pipes aligned in a straight line is located between two adjacent substrates W. Of the two bubble generating pipes, one bubble generating pipe extends beyond the intermediate point of the two adjacent substrates W. The one bubble generating pipe is provided with an opening 136p at the intermediate point between the two adjacent substrates W.

For example, the bubble generating pipes 136d and 136h are aligned in a straight line. When viewed in a plan view, the boundary between the bubble generating pipes 136d and 136h is located between two adjacent substrates W. Of the bubble generating pipes 136d and 136h, the bubble generating pipe 136d extends beyond the intermediate point of the two adjacent substrates W. The bubble generating pipe 136d is provided with an opening 136p at the intermediate point between the two adjacent substrates W.

In the substrate processing apparatus 100 according to the embodiment, the plurality of substrates W aligned along the Y-axis are supplied with gasses having different flow rates through the bubble generating pipes 136a to 136d arranged at the negative half side of the Y-axis and the bubble generating pipes 136e to 136h arranged at the positive half side of the Y-axis. As a result, bubbles can be generated substantially evenly for the surfaces of the substrates W, so that uneven processing can be suppressed in the surfaces of the substrates W.

When the bubble generating pipes 136a to 136h are supplied with their respective gases from the gas supply pipes 134a to 134h, the flow rates on the upstream side of the bubble generating pipes 136a to 136h may be larger than the flow rates on the downstream side thereof. In this case, in the substrate processing apparatus 100 according to the embodiment, the substrates W aligned along the Y-axis are supplied with their respective gases through the bubble generating pipes 136a to 136d arranged at the negative half side of the Y-axis and the bubble generating pipes 136e to 136h arranged at the positive half side of the Y-axis. Therefore, first and second ends of a substrate row formed of the substrates W aligned along the Y-axis can be supplied with their respective gases at a relatively high flow rate. As a result, bubbles can be evenly generated in the alignment direction of the substrates W, and processing unevenness in the alignment direction of the substrates W can be suppressed.

In the substrate processing apparatus 100 illustrated in FIG. 9, the flow rate control mechanisms 140a to 140h are provided for the bubble generating pipes 136a to 136h, respectively, but the embodiment is not limited to this. One flow rate control mechanism 140 may control a flow rate of a gas supplied to each of bubble generating pipes 136.

As illustrated in FIG. 10A, bubble generating pipes 136a to 136d extending along the Y-axis are arranged in a processing tank 110. The bubble generating pipes 136a to 136*d* are arranged in this order at equal intervals from the negative half side to the positive half side of the X-axis.

Gas supply pipes 134 include a common pipe 134*s*, a common pipe 134*t*, and gas supply pipes 134*a* to 134*d*. The common pipe 134*s* connects a gas supply source 132 and a flow rate control mechanism 140*a*. The gas supply pipes 134*a* connects the flow rate control mechanism 140*a* and the bubble generating pipe 136*a*. The gas supply pipes 134*d* connects the flow rate control mechanism 140*a* and the bubble generating pipe 136*d*.

The common pipe 134*t* connects the gas supply source 132 and a flow rate control mechanism 140*b*. The gas supply pipe 134*b* connects the flow rate control mechanism 140*b* and the bubble generating pipe 136*b*. The gas supply pipe 134*c* connects the flow rate control mechanism 140*b* and the bubble generating pipe 136*c*.

Therefore, the bubble generating pipes 136*a* and 136*d* are supplied with their respective gases whose flow rates are controlled by the flow rate control mechanism 140*a*. Further, the bubble generating pipes 136*b* and 136*c* are supplied with their respective gases whose flow rates are controlled by the flow rate control mechanism 140*b*.

Therefore, the flow rates of the gases supplied to the outer bubble generating pipes 136*a* and 136*d* in the processing tank 110 can be made larger than the flow rates of the gases supplied to the inner bubble generating pipes 136*b* and 136*c* in the processing tank 110. As a result, the bubble generating pipes 136*a* to 136*d* can generate their respective gases at almost an equal amount, and processing unevenness can be suppressed over the surfaces of substrates W.

In the substrate processing apparatus 100 illustrated in FIGS. 1A to 10A, the substrates W are supplied with bubbles generated from the four bubble generating pipes 136, but the embodiment is not limited to this. The substrates W may be supplied with bubbles generated from bubble generating pipes 136 whose number is other than 4. For example, the substrates W may be supplied with bubbles generated from six bubble generating pipes 136.

As illustrated in FIG. 10B, bubble generating pipes 136*a* to 136*f* are arranged in a processing tank 110. The bubble generating pipes 136*a* to 136*f* are arranged in order at equal intervals from the negative half side to the positive half side of the X-axis in the processing tank 110. The bubble generating pipes 136*a*, 136*b*, 136*e*, and 136*f* exemplify outer bubble generating pipes. The bubble generating pipes 136*c* and 136*d* exemplify inner bubble generating pipes.

A gas supply source 132 is connected with a common pipe 134*s*, a common pipe 134*t*, and a common pipe 134*u*. The common pipe 134*s* is connected with a gas supply pipe 134*a* and a gas supply pipe 134*b*. The gas supply pipe 134*a* connects the common pipe 134*s* and the bubble generating pipe 136*a*. The gas supply pipe 134*b* connects the common pipe 134*s* and the bubble generating pipe 136*b*.

The common pipe 134*t* connects a gas supply pipe 134*c* and a gas supply pipe 134*d*. The gas supply pipe 134*c* connects the common pipe 134*t* and the bubble generating pipe 136*c*. The gas supply pipe 134*d* connects the common pipe 134*t* and the bubble generating pipe 136*d*. Similarly, the common pipe 134*u* is connected to a gas supply pipe 134*e* and a gas supply pipe 134*f*. The gas supply pipe 134*e* connects the common pipe 134*u* and the bubble generating pipe 136*e*. The gas supply pipe 134*f* connects the common pipe 134*u* and the bubble generating pipe 136*f*.

Here, the common pipe 134*s* is provided with a flow rate control mechanism 140*a*. This configuration enables the flow rate control mechanism 140*a* to control the flow rates of gases supplied to the bubble generating pipes 136*a* and 136*b*.

Further, the common pipe 134*t* is provided with a flow rate control mechanism 140*b*. This configuration enables the flow rate control mechanism 140*b* to control the flow rates of gases supplied to the bubble generating pipes 136*c* and 136*d*. Similarly, the common pipe 134*u* is provided with a flow control mechanism 140*c*. This enables the flow rate control mechanism 140*c* to control the flow rates of gases supplied to the bubble generating pipes 136*e* and 136*f*.

In the substrate processing apparatus 100 illustrated in FIGS. 2 to 10B, the bubble generating pipes 136 are connected with gas supply pipes 134 extending from one side of the processing tank 110, but the embodiment is not limited to this. The bubble generating pipes 136 may be connected to gas supply pipes 134 extending from both sides of the processing tank 110.

Next, a substrate processing apparatus 100 according to the embodiment will be described with reference to FIGS. 1A to 11. FIG. 11 is a schematic top view of the substrate processing apparatus 100 according to the embodiment.

As illustrated in FIG. 11, bubble generating pipes 136*a* to 136*h* are arranged in a processing tank 110. The bubble generating pipes 136*a* to 136*d* are connected with gas supply pipes 134*a* to 134*d* extending from the negative half side to the positive half side of the Y-axis in the processing tank 110. The bubble generating pipes 136*e* to 136*h* are connected with gas supply pipes 134*e* to 134*h* extending from the positive half side to the negative half side of the Y-axis in the processing tank 110.

The bubble generating pipes 136*a*, 136*e*, 136*b*, 136*f*, 136*c*, 136*g*, 136*d*, and 136*h* are arranged in order at equal intervals from the negative half side to the positive half side of the X-axis in the processing tank 110. The bubble generating pipes 136*a*, 136*d*, 136*e* and 136*h* exemplify outer bubble generating pipes. The bubble generating pipes 136*b*, 136*c*, 136*f*, and 136*g* exemplify inner bubble generating pipes.

The gas supply pipes 134*a* to 134*d* are connected to a gas supply source 132. Therefore, the gas supply pipes 134*a* to 134*d* connect the gas supply source 132 and the bubble generating pipes 136*a* to 136*d*, respectively. The gas supply pipes 134*e* to 134*h* are also connected with a gas supply source 132. Therefore, the gas supply pipes 134*e* to 134*h* connect the gas supply source 132 and the bubble generating pipes 136*e* to 136*h*, respectively. Flow rate control mechanisms 140*a* to 140*h* are arranged in the gas supply pipes 134*a* to 134*h*, respectively.

In the present embodiment, the flow rates of gases supplied to the outer bubble generating pipes 136*a* and 136*h* in the processing tank 110 can be made larger than the flow rates of gases supplied to the inner bubble generating pipes 136*b* to 136*g* in the processing tank 110. Further, the flow rates of gases supplied to the bubble generating pipes 136*e* and 136*d* located second furthest from the inside of the processing tank 110 can be made larger than the flow rates of gases supplied to the bubble generating pipes 136*b*, 136*c*, 136*f*, and 136*g* located closer to the center of the processing tank 110. In addition, the flow rates of gases supplied to the bubble generating pipes 136*b* and 136*g* located third furthest from the inside of the processing tank 110 may be made larger than the flow rates of gases supplied to the bubble generating pipes 136*c* and 136*f* located closer to the center of the processing tank 110. The flow rates of the gases supplied to the bubble generating pipes 136*a* to 136*h* are controlled stepwise in this way, so that the bubble generating pipes 136*a* to 136*h* can each generate bubbles at almost an equal amount and uneven processing can be suppressed over the surfaces of substrates W.

In the above description with reference to FIGS. 1A to 11, the substrates W are supplied with the gases from the bottom side of a processing liquid L stored in the processing tank 110, but the embodiment is not limited to this. The substrates W may be supplied, from the bottom side of the processing liquid L stored in the processing tank 110, with not only the gases but also a liquid.

Next, a substrate processing apparatus 100 according to the embodiment will be described with reference to FIGS. 1A to 12. FIG. 12 is a schematic view of the substrate processing apparatus 100 according to the embodiment. The substrate processing apparatus 100 illustrated in FIG. 12 has the same configuration as the substrate processing apparatus 100 described above with reference to FIG. 2, except that a liquid supply section 150 is further provided. Duplicate description is omitted for the purpose of avoiding redundancy.

As illustrated in FIG. 12, the substrate processing apparatus 100 further includes the liquid supply section 150. The liquid supply section 150 supplies a liquid in a processing tank 110. Typically, the liquid supply section 150 supplies a processing liquid L in the processing tank 110. In this case, it is preferable that the liquid to flow upward from the lower position in the processing tank 110 be supplied from the liquid supply section 150 to the processing liquid L. As an example, the liquid may be the same type of processing liquid L as the processing liquid L stored in the processing tank 110.

When the liquid supply section 150 supplies a processing liquid L, the processing liquid supplied upward moves upward along the surfaces of substrates W in the processing liquid while pushing contact part with the substrates W. A fresh processing liquid L existing in the surroundings enters the place after the processing liquid flowing upward has passed. In this way, the processing liquid flowing upward comes into contact with the surfaces of the substrates W, so that agitation becomes possible at the surface side of each substrate W. Accordingly, the processing liquid L on the surface of each substrate W can be replaced with the fresh processing liquid. As a result, the processing speed of the substrates W can be improved.

The liquid supply section 150 includes a liquid supply source 152, liquid supply pipes 154, and liquid discharge pipes 156. The liquid is supplied from the liquid supply source 152. The liquid supply source 152 is located outside the processing tank 110. Note that the liquid supply source 152 may be used so as to circulate the liquid once used as the processing liquid L in the processing tank 110. The liquid discharge pipes 156 extend along the Y-axis. Here, the liquid discharge pipes 156 extend parallel to bubble generating pipes 136.

The liquid supply pipes 154 are connected with the liquid supply source 152 and the liquid discharge pipes 156. The liquid supplied from the liquid supply source 152 flows through the liquid supply pipes 154 to the liquid discharge pipes 156. At least part of each liquid supply pipe 154 is arranged outside the processing tank 110.

The liquid discharge pipes 156 are arranged in the processing tank 110. Typically, the liquid discharge pipes 156 are arranged at the bottom side of the processing tank 110. The liquid discharge pipes 156 may be arranged vertically above the bubble generating pipes 136. Alternatively, the liquid discharge pipes 156 may be arranged vertically below the bubble generating pipes 136.

Next, a substrate processing apparatus 100 according to the embodiment will be described with reference to FIGS. 1A to 13B. FIG. 13A is a schematic top view of the substrate processing apparatus 100 according to the embodiment. FIG. 13B is a schematic view of the substrate processing apparatus 100. The substrate processing apparatus 100 illustrated in FIGS. 13A and 13B has the same configuration as the substrate processing apparatus 100 described above with reference to FIGS. 3B and 4, except that a liquid supply section 150 is further provided. Duplicate description is omitted for the purpose of avoiding redundancy.

As illustrated in FIG. 13A, liquid discharge pipes 156 include a liquid discharge pipe 156*a* and a liquid discharge pipe 156*b*. The liquid discharge pipes 156*a* and 156*b* extend in parallel with each other. The liquid discharge pipes 156*a* and 156*b* extend along the Y-axis. The liquid discharge pipes 156*a* and 156*b* are arranged in this order from the negative half side to the positive half side of the X-axis. The liquid discharge pipe 156*a* is arranged between a bubble generating pipe 136*a* and a bubble generating pipe 136*b*. The liquid discharge pipe 156*b* is arranged between a bubble generating pipe 136*c* and a bubble generating pipe 136*d*.

The liquid discharge pipe 156*a* is supplied with a liquid passing through a liquid supply pipe 154*a* from a liquid supply source 152. Further, the liquid discharge pipe 156*b* is supplied with a liquid passing through a liquid supply pipe 154*b* from the liquid supply source 152.

Each of the liquid discharge pipes 156*a* and 156*b* is provided with a plurality of openings 156*p*. The distance between the plurality of openings 156*p* is substantially equal to the distance between substrates W. Each of the plurality of openings 156*p* is located between corresponding adjacent substrates W aligned in an alignment direction thereof. The liquid discharge pipes 156*a* and 156*b* have a similar configuration. In this specification, the liquid discharge pipes 156*a* and 156*b* may be collectively referred to as the liquid discharge pipes 156.

In each liquid discharge pipe 156, the plurality of openings 156*p* are aligned in a row. The liquid discharge pipe 156 discharges a processing liquid L to a processing tank 110 from the plurality of openings 156*p*. In this case, it is preferable that the plurality of openings 156*p* face upward from the lower position with respect to the processing liquid L in the processing tank 110. Here, the plurality of openings 156*p* are equal in size and intervals.

As illustrated in FIG. 13B, the bubble generating pipes 136*a* to 136*d* and the liquid discharge pipes 156*a* and 156*b* are arranged in the processing tank 110. The bubble generating pipes 136*a* to 136*d* are provided, above the bubble generating pipes 136*a* to 136*d*, with the openings 136*p* so that their respective discharge directions are directed in the vertical direction.

On the other hand, the liquid discharge pipes 156*a* and 156*b* are provided, at a position inclined with respect to the vertical direction (Z-axis), with the openings 156*p* so that their respective discharge directions face the center of each substrate W. Therefore, when diagonally upward liquids discharged from the openings 156*p* of the liquid discharge pipe 156*a* merge with diagonally upward liquid flows discharged from the openings 156*p* of the liquid discharge pipe 156*b*, a very strong upflow flowing upward inside the processing tank 110 can be formed.

Next, a substrate processing apparatus 100 according to the embodiment will be described with reference to FIGS. 1A to 14B. FIG. 14A is a schematic view illustrating bubbles generated when a plurality of gas supply pipes are supplied with their respective gases at an equal flow rate, in the substrate processing apparatus. FIG. 14B is a schematic view illustrating the flow of a processing liquid in the substrate processing apparatus 100 according to the embodiment. The substrate processing apparatus illustrated in FIGS. 14A and 14B has the same configuration as the substrate processing apparatus 100 described above with reference to FIGS. 4A and 4B, except that liquid discharge pipes 156 are arranged in a processing tank 110. Duplicate description is omitted for the purpose of avoiding redundancy. Here, bubble generating pipes 136a to 136d are supplied with their respective gases at an equal amount through flow rate control mechanisms 140a to 140d.

As illustrated in FIG. 14A, when the bubble generating pipes 136a to 136d are supplied with their respective gases, bubbles are generated in the processing liquid L. The bubble generating pipes 136a to 136d each discharge a gas into the processing liquid L in the processing tank 110, so that bubbles are generated in the processing liquid L. The bubbles generated in the processing liquid L float in the processing liquid L and reach the interface between gas (for example, air or a predetermined atmosphere) and the processing liquid L in the processing tank 110. Here, when diagonally upward liquids discharged from openings 156p of a liquid discharge pipe 156a merge with diagonally upward liquid flows discharged from openings 156p of a liquid discharge pipe 156b, a very strong upflow flowing upward inside the processing tank 110 can be formed.

The bubble generating pipes 136a to 136d are supplied with their respective gasses at an equal flow rate, and then each generate bubbles at different amounts. The amount of bubbles generated from the bubble generating pipe 136a is smaller than the amount of bubbles generated from the bubble generating pipe 136b. Similarly, the amount of bubbles generated from the bubble generating pipe 136d is smaller than the amount of bubbles generated from the bubble generating pipe 136c.

As illustrated in FIG. 14B, the bubbles generated from the bubble generating pipes 136a to 136d float in the processing liquid L, so that the flow of the processing liquid L is generated in the processing tank 110. Here, a very strong upflow is formed so that the bubbles rise quickly. When the bubbles float up, the processing liquid L flows to the interface between gas (for example, air or a predetermined atmosphere) and the processing liquid L in the processing 110 and then flows toward positive and negative half sides of the X-axis at upper part of the processing liquid L. The processing liquid L subsequently forms a downward flow that strongly flows downward along the outer side walls on the negative and positive half sides of the X-axis.

As described above, the outer bubble generating pipes 136a and 136d in the processing tank 110 are strongly affected by the downward flow of the processing liquid L flowing downward from upper part of the processing tank 110 as compared with the inner bubble generating pipes 136b and 136c in the processing tank 110. Therefore, even if the bubble generating pipes 136a to 136d are supplied with their respective gasses at an equal amount, the bubble generating pipes 136a to 136d each generate bubbles at different amounts. Specifically, the amount of bubbles generated from the outer bubble generating pipes 136a and 136d in the processing tank 110 becomes smaller than the amount of bubbles generated from the bubble generating pipes 136b and 136c in the processing tank 110.

Next, a substrate processing apparatus 100 according to the embodiment will be described with reference to FIGS. 15A and 15B. FIG. 15A is a schematic top view of the substrate processing apparatus 100 according to the embodiment. FIG. 15B is a schematic view of the substrate processing apparatus 100 in which a plurality of bubble generating pipes 136 are supplied with their respective gases at different flow rates, thereby generating bubbles.

As illustrated in FIG. 15A, bubble generating pipes 136a to 136d are supplied with their respective gases at different flow rates according to control by flow rate control mechanisms 140a to 140d. The flow rate control mechanisms 140a and 140b control the flow rates of gases flowing through gas supply pipes 134a and 134b so that the flow rate of the gas supplied to the bubble generating pipe 136a is larger than the flow rate of the gas supplied to the bubble generating pipe 136b. Further, the flow rate control mechanisms 140c and 140d control the flow rates of gases flowing through gas supply pipes 134c and 134d so that the flow rate of the gas supplied to the bubble generating pipe 136d is larger than the flow rate of the gas supplied to the bubble generating pipe 136c.

Therefore, the flow rates of the gases supplied to the outer bubble generating pipes 136a and 136d in a processing tank 110 are larger than the flow rates of the gases supplied to the inner bubble generating pipes 136b and 136c in the processing tank 110.

As illustrated in FIG. 15B, the bubble generating pipes 136a to 136d are supplied with their respective gases, and then each generate bubbles into a processing liquid L. Here, the bubble generating pipes 136a to 136d each generate bubbles at almost an equal amount. Specifically, the bubble generating pipes 136a to 136d each generate bubbles having substantially the same size at the same frequency.

In the substrate processing apparatus 100 according to the embodiment, the flow rates of the gases supplied to the outer bubble generating pipes 136a and 136d in the processing tank 110 are larger than the flow rates of the gases supplied to the inner bubble generating pipes 136b and 136c in the processing tank 110. This configuration enables the bubble generating pipes 136a to 136d to each generate bubbles in almost an equal amount. When the upflow is formed in particular, the speed of substrate processing increases with the flow of bubbles. Even when the substrate processing is performed at such a high speed, processing unevenness can be suppressed over the surfaces of each substrate W.

Next, a substrate processing apparatus 100 according to the embodiment will be described with reference to FIGS. 1A to 16. FIG. 16 is a schematic view of the substrate processing apparatus 100 according to the embodiment.

As illustrated in FIG. 16, a processing tank 110 has a double tank structure including an inner tank 112 and an outer tank 114. The inner tank 112 and the outer tank 114 each have an upper opening that opens upward. The inner tank 112 is configured to store a processing liquid L and to accommodate a plurality of substrates W. The outer tank 114 is provided on the outer peripheral surface of an upper opening of the inner tank 112.

The substrate processing apparatus 100 further includes a flow rate adjusting mechanism 160. The flow rate adjusting mechanism 160 is used for circulation of the processing liquid L. In substrate processing, the flow rate adjusting mechanism 160 circulates the processing liquid L stored in the processing tank 110 and supplies the processing liquid L to each of liquid discharge pipes 156.

The flow rate adjusting mechanism 160 includes a pipe 161, a pump 162, a heater 163, a filter 164, an adjusting valve 165 and a valve 166. The pump 162, the heater 163, the filter 164, the adjusting valve 165 and the valve 166 are arranged in this order from the upstream to the downstream of the pipe 161.

The pipe 161 guides the processing liquid L discharged from the processing tank 110 to the processing tank 110 again. The plurality of liquid discharge pipes 156 are connected to the downstream end of the pipe 161. The liquid discharge pipes 156 supply the processing liquid L supplied from the pipe 161 to the processing tank 110.

The pump 162 sends the processing liquid L from the pipe 161 to the plurality of liquid discharge pipes 156. Therefore, the heater 163 heats the processing liquid L flowing through the pipe 161. The temperature of the processing liquid L is adjusted by the heater 163. The filter 164 filters the processing liquid L flowing through the pipe 161.

The adjusting valve 165 adjusts the opening degree of the pipe 161 to adjust the flow rate of the processing liquid L supplied to the plurality of liquid discharge pipes 156. Specifically, the adjusting valve 165 includes a valve body (not illustrated) having a valve seat inside, a valve element that opens and closes the valve seat, and an actuator (not illustrated) that moves the valve element between an open position and a closed position. The valve 166 opens and closes the pipe 161.

The plurality of liquid discharge pipes 156 supply the processing liquid L to the inner tank 112 of the processing tank 110. The plurality of liquid discharge pipes 156 are arranged, at the bottom side of the inner tank 112, inside the inner tank 112 of the processing tank 110. Each of the plurality of liquid discharge pipes 156 has a substantially tubular shape.

Each of the plurality of liquid discharge pipes 156 has a plurality of openings 156*p*. FIG. 16 illustrates one opening 156*p* for one liquid discharge pipe 156. Each of the plurality of liquid discharge pipes 156 supplies the processing liquid L to the inner tank 112 from the plurality of openings 156*p*.

The substrate processing apparatus 100 further includes a processing liquid supply section 150A and a diluent supply section 150B. The processing liquid supply section 150A supplies the processing liquid L to the processing tank 110. For example, a solution in which approximately 85% by mass of phosphoric acid (H$_3$PO$_4$) and approximately 15% by mass of water (deionized water) are mixed can be employed as the processing liquid L.

The processing liquid supply section 150A includes a nozzle 152A, a pipe 154A, and a valve 156A. The nozzle 152A discharges the processing liquid L to the inner tank 112. The nozzle 152A is connected to the pipe 154A. The pipe 154A is supplied with the processing liquid L from a processing liquid supply source TKA. The valve 156A is arranged in the pipe 154A. When the valve 156A is opened, the processing liquid L discharged from the nozzle 152A is supplied into the inner tank 112.

The diluent supply section 150B supplies a dilute solution to the processing tank 110. The diluent supply section 150B includes a nozzle 152B, a pipe 154B, and a valve 156B. The nozzle 152B discharges the dilute solution to the outer tank 114. The nozzle 152B is connected to the pipe 154B. Any of DIW (deionized water), carbonated water, electrolytic ionized water, hydrogen water, ozone water and hydrochloric acid water having a dilution concentration (for example, about 10 ppm to 100 ppm) may be adopted as the dilute solution supplied to the pipe 154B. The pipe 154B is supplied with the dilute solution from a dilute solution supply source TKB. The valve 156B is arranged in the pipe 154B. When the valve 156B is opened, the dilute solution discharged from the nozzle 152B is supplied into the outer tank 114.

The substrate processing apparatus 100 further includes a drainage section 170. The drainage section 170 drains the processing liquid L in the processing tank 110.

The drainage section 170 includes a drainage pipe 170*a* and a valve 170*b*. The drainage pipe 170*a* is connected to the bottom wall of the inner tank 112 of the processing tank 110. The valve 170*b* is arranged in the drainage pipe 170*a*. When the valve 170*b* is opened, the processing liquid L stored in the inner tank 112 is drained to the outside through the drainage pipe 170*a*. The processing liquid L to be drained is sent to a waste liquid treatment device (not illustrated) for treatment.

The embodiment of the present disclosure has been described above with reference to the drawings. However, the present disclosure is not limited to the above-described embodiment, and may be implemented in various aspects without departing from the gist thereof. In addition, various aspects may be created by appropriately combining the plurality of components disclosed in the above-described embodiment. For example, some components may be removed from all the components described in the embodiment. Further, components across different configurations may be combined as appropriate. The drawings schematically illustrate each component as a main body in order to make it easier to understand. The thickness, length, number, intervals and the like of illustrated components may differ from the actual ones for the convenience of the drawing. Further, the material, shape, dimensions or the like of each component illustrated in the above embodiment are examples and not particularly limited, and various modifications may be made without substantially deviating from the effects of the present disclosure.

For example, in the above description with reference to FIGS. 1A to 16, each bubble generating pipe 136 extends parallel to the normal direction (Y-axis) of the main surfaces of substrates W, but the embodiment is not limited to this. However, it is preferable that different bubble generating pipes 136 be arranged below each of the central region and the outer peripheral regions of one substrate W.

What is claimed is:

1. A substrate processing apparatus comprising:
   a substrate holder that holds a plurality of substrates such that the plurality of substrates are aligned in a row in a row direction so as to form a substrate row;
   a processing tank that stores a processing liquid allowing the plurality of substrates held by the substrate holder to be immersed in;
   an outer bubble generating pipe that is located below an outer region of each of the plurality of substrates immersed in the processing liquid and that supplies a gas to the processing liquid so as to generate bubbles in the processing liquid, the outer bubble generating pipe including a first outer bubble generating pipe arranged at a first side of the substrate row, and a second outer bubble generating pipe arranged at a second side of the substrate row, the second outer bubble generating pipe being spaced apart from the first outer bubble generating pipe and aligned in a straight line along with the first outer bubble generating pipe;
   an inner bubble generating pipe that is located below a central region of each of the plurality of substrates immersed in the processing liquid and that supplies a gas to the processing liquid so as to generate bubbles in the processing liquid, the inner bubble generating pipe including a first inner bubble generating pipe arranged at the first side of the substrate row, and a second inner bubble generating pipe arranged at the second side of the substrate row, the second inner bubble generating pipe being spaced apart from the first inner bubble generating pipe and aligned in a straight line along with the first inner bubble generating pipe;

an outer gas supply pipe including a first outer gas supply pipe connected between the first outer bubble generating pipe and a gas supply source, and a second outer gas supply pipe connected between the second outer bubble generating pipe and the gas supply source;

an inner gas supply pipe including a first inner gas supply pipe connected between the first inner bubble generating pipe and the gas supply source, and a second inner gas supply pipe connected between the second inner bubble generating pipe and the gas supply source;

an outer valve that controls a flow rate of a gas flowing through the outer gas supply pipe, the outer valve including a first outer valve that controls a flow rate of a gas flowing through the first outer gas supply pipe, and a second outer valve that controls a flow rate of a gas flowing through the second outer gas supply pipe;

an inner valve that controls a flow rate of a gas flowing through the inner gas supply pipe, the inner valve including a first inner valve that controls a flow rate of a gas flowing through the first inner gas supply pipe, and a second inner valve that controls a flow rate of a gas flowing through the second inner gas supply pipe; and a controller that controls the outer valve and the inner valve such that a flow rate of a gas supplied to the outer bubble generating pipe is larger than a flow rate of a gas supplied to the inner bubble generating pipe; wherein the first outer bubble generating pipe and the second outer bubble generating pipe are arranged such that, when viewed from above, a gap between the first outer bubble generating pipe and the second outer bubble generating pipe is located entirely between two adjacent substrates of the plurality of substrates held by the substrate holder, and that one of the first outer bubble generating pipe and the second outer bubble generating pipe extends beyond an intermediate point of the two adjacent substrates in the row direction, the one of the first outer bubble generating pipe and the second outer bubble generating pipe is provided with an opening at the intermediate point of the two adjacent substrates in the row direction, the first inner bubble generating pipe and the second inner bubble generating pipe are arranged such that, when viewed from above, a gap between the first inner bubble generating pipe and the second inner bubble generating pipe is located entirely between the two adjacent substrates of the plurality of substrates held by the substrate holder, and that one of the first inner bubble generating pipe and the second inner bubble generating pipe extends beyond the intermediate point of the two adjacent substrates in the row direction, and the one of the first inner bubble generating pipe and the second inner bubble generating pipe is provided with an opening at the intermediate point of the two adjacent substrates in the row direction.

2. The substrate processing apparatus according to claim 1, wherein the first outer bubble generating pipe, the second outer bubble generating pipe, the first inner bubble generating pipe and the second inner bubble generating pipe extend parallel to a normal direction of a main surface of each of the plurality of substrates.

3. The substrate processing apparatus according to claim 1, further comprising a first pressure gauge that measures a pressure of the gas flowing through the outer gas supply pipe connected to the outer bubble generating pipe; and a second pressure gauge that measures pressure of the gas flowing through the inner gas supply pipe connected to the inner bubble generating pipe.

4. The substrate processing apparatus according to claim 3, wherein the controller controls the flow rate of the gas flowing through the outer gas supply pipe and the flow rate of the gas flowing through the inner gas supply pipe based on the pressure of the gas flowing through the outer gas supply pipe connected to the outer bubble generating pipe, and the pressure of the gas flowing through the inner gas supply pipe connected to the inner bubble generating pipe.

5. The substrate processing apparatus according to claim 3 further comprising storage that stores a control program, wherein the controller controls the outer valve and the inner valve according to the control program.

6. The substrate processing apparatus according to claim 3, wherein the first pressure gauge measures a first pressure of the gas flowing through the outer gas supply pipe and the second pressure gauge measures a second pressure of the gas flowing through the inner gas supply pipe while the controller controls the outer valve and the inner valve such that the flow rate of the gas supplied to the outer bubble generating pipe is equal to the flow rate of the gas supplied to the inner bubble generating pipe during the substrate holder holding the plurality of substrates immersed in the processing liquid in the processing tank, the controller acquires a first flow rate of the gas that is to flow through the outer gas supply pipe and a second flow rate of the gas that is to flow through the inner gas supply pipe based on the first pressure and the second pressure respectively measured by the first pressure gauge and the second pressure gauge, and the controller controls the outer valve and the inner valve to control the flow rate of the gas flowing through the outer gas supply pipe and the flow rate of the gas flowing through the inner gas supply pipe based on the first flow rate and the second flow rate so that the flow rate of the gas supplied to the outer bubble generating pipe is larger than the flow rate of the gas supplied to the inner bubble generating pipe.

7. The substrate processing apparatus according to claim 1 further comprising a liquid discharge pipe located in the processing tank.

8. The substrate processing apparatus according to claim 7, wherein the liquid discharge pipe extends parallel to a normal direction of a main surface of each of the plurality of substrates.

9. The substrate processing apparatus according to claim 1, wherein the processing liquid contains a phosphoric acid liquid.

* * * * *